(12) United States Patent
Hino et al.

(10) Patent No.: US 9,343,946 B2
(45) Date of Patent: *May 17, 2016

(54) ACTUATOR, OPTICAL SCANNER, AND IMAGE FORMING APPARATUS

(71) Applicant: Seiko Epson Corporation, Tokyo (JP)

(72) Inventors: Makiko Hino, Matsumoto (JP); Yasushi Mizoguchi, Suwa (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/565,002

(22) Filed: Dec. 9, 2014

(65) Prior Publication Data
US 2015/0092216 A1    Apr. 2, 2015

Related U.S. Application Data

(63) Continuation of application No. 13/442,318, filed on Apr. 9, 2012.

(30) Foreign Application Priority Data

Apr. 11, 2011 (JP) ................. 2011-087764

(51) Int. Cl.
| | |
|---|---|
| *G06F 3/12* | (2006.01) |
| *H02K 33/16* | (2006.01) |
| *G02B 26/10* | (2006.01) |
| *H04N 3/08* | (2006.01) |
| *G02B 7/182* | (2006.01) |
| *B81B 3/00* | (2006.01) |
| *G06F 15/00* | (2006.01) |

(Continued)

(52) U.S. Cl.
CPC .............. *H02K 33/16* (2013.01); *B81B 3/0072* (2013.01); *G02B 7/1821* (2013.01); *G02B 26/085* (2013.01); *G02B 26/101* (2013.01); *G02B 26/105* (2013.01); *H04N 3/08* (2013.01); *B81B 2201/042* (2013.01); *B81B 2203/0109* (2013.01); *B81B 2203/0154* (2013.01); *G02B 26/0841* (2013.01); *G03B 27/526* (2013.01); *G06F 15/00* (2013.01)

(58) Field of Classification Search
USPC ............. 358/1.13, 1.15, 474, 505; 359/212.1, 359/212.2, 213.1; 399/53, 64, 213, 216
See application file for complete search history.

(56) References Cited

U.S. PATENT DOCUMENTS

| | | | |
|---|---|---|---|
| 7,697,185 B2 | 4/2010 | Yoda | |
| 2003/0016428 A1 | 1/2003 | Kato et al. | |

(Continued)

FOREIGN PATENT DOCUMENTS

| | | |
|---|---|---|
| JP | 2003-131161 A | 5/2003 |
| JP | 2005-345837 A | 12/2005 |

(Continued)

*Primary Examiner* — Vu B Hang
(74) *Attorney, Agent, or Firm* — Harness, Dickey & Pierce, P.L.C.

(57) ABSTRACT

An actuator including a movable portion that swings about a swing axis, a connecting portion that extends from the movable portion and torsionally deforms in response to the swinging of the movable portion, and a support portion that supports the connecting portion, wherein the movable portion is so shaped that the length thereof parallel to the swing axis decreases stepwise with distance from the swing axis in a plan view, and the movable portion, the support portion, and the connecting portion are formed by anisotropically etching a silicon substrate.

11 Claims, 18 Drawing Sheets

(51) Int. Cl.
  *G02B 26/08* (2006.01)
  *G03B 27/52* (2006.01)

(56) References Cited

U.S. PATENT DOCUMENTS

| 2005/0185237 A1* | 8/2005 | Nakajima ............... 359/212 |
| 2005/0185240 A1 | 8/2005 | Kato et al. |
| 2009/0073524 A1 | 3/2009 | Nakajima |
| 2009/0223924 A1 | 9/2009 | Asai et al. |
| 2009/0231653 A1 | 9/2009 | Nakamura et al. |
| 2011/0102870 A1 | 5/2011 | Nakamura et al. |

FOREIGN PATENT DOCUMENTS

| JP | 2005-345866 A | 12/2005 |
| JP | 2010-079243 A | 4/2010 |
| JP | 2011-107675 A | 6/2011 |
| JP | 2011-170370 A | 9/2011 |

\* cited by examiner

ACTUATOR, OPTICAL SCANNER, AND IMAGE FORMING APPARATUS

CROSS-REFERENCE TO RELATED APPLICATIONS

This is a continuation patent application of U.S. application Ser. No. 13/442,318 filed Apr. 9, 2012, which claims priority to Japanese Patent Application No. 2011-087764, filed Apr. 11, 2011, all of which are expressly incorporated by reference herein in their entireties.

BACKGROUND

1. Technical Field

The present invention relates to an actuator, an optical scanner, and an image forming apparatus.

2. Related Art

An actuator using a torsional oscillator has been known (see JP-A-2010-79243, for example).

For example, JP-A-2010-79243 discloses an optical deflector including a movable plate (movable portion), a support frame (support portion), and a pair of elastic support portions (connecting portions) that torsionally and pivotally (swingably) support the movable plate relative to the support frame, and each of the elastic support portions is formed of two bars (beam members).

The movable plate, the support frame, and the pair of elastic support portions are formed integrally with each other by anisotropically etching a silicon substrate having silicon (100) principal surfaces.

Further, in the optical deflector according to JP-A-2010-79243, the movable plate has an octagonal shape in a plan view. The movable plate having an octagonal shape in a plan view is advantageous in that the weight of portions of the movable plate that are apart from a pivotal (swing) axis and hence the moment of inertia are reduced.

The movable plate having an octagonal shape in a plan view is, however, problematic in that the shape is difficult to manufacture. In particular, when a movable plate of this type is manufactured by using anisotropic etching as described above, the combination of anisotropic etching and the crystal surface of the movable plate makes it difficult to control the shape of the movable plate, disadvantageously resulting in large variation in the shape.

SUMMARY

An advantage of some aspects of the invention is to provide an actuator, an optical scanner, and an image forming apparatus including a movable portion manufacturable with a smaller amount of variation in the shape thereof than in related art and having a small moment of inertia at the time of pivotal (swing) motion.

An aspect of the invention is directed to a actuator including a movable portion that swings about a swing axis, a connecting portion that extends from the movable portion and torsionally deforms in response to the swinging of the movable portion, and a support portion that supports the connecting portion, wherein the movable portion is so shaped that the length thereof parallel to the swing axis decreases stepwise with distance from the swing axis in a plan view, and the movable portion, the support portion, and the connecting portion are formed by anisotropically etching a silicon substrate.

The actuator according to the aspect of the invention includes a movable portion manufacturable with a small amount of variation in the shape thereof and having a small moment of inertia at the time of the swinging.

In the actuator according to the aspect of the invention, the length of the movable portion parallel to the swing axis preferably decreases in two steps with distance from the axis in the plan view.

The thus shaped movable portion has an area and a thickness that allows the movable portion to pivot at a resonance frequency (ranging from 4 to 40 kHz), which is suitable for optical scanning, with dynamic distortion suppressed.

In the actuator according to the aspect of the invention, the movable portion preferably has an outer shape in the plan view that is formed primarily of a line segment parallel to the swing axis and a line segment perpendicular to the swing axis.

The thus shaped movable portion described above allows variation in the shape thereof in a manufacturing process to be reduced.

In the actuator according to the aspect of the invention, each plate surface of the movable portion is preferably formed of a silicon (100) surface.

Anisotropically etching a silicon substrate having silicon (100) plate surfaces allows the variation in the shape of the movable portion to be reduced and the movable portion, the support portion, and the connecting portion to be readily formed.

In the actuator according to the aspect of the invention, a side surface of the movable portion is preferably primarily formed of a silicon (111) surface.

Anisotropically etching a silicon substrate having silicon (100) plate surfaces and using the silicon (111) surface as an etching stop layer allow the variation in the shape of the movable portion to be reduced and the movable portion, the support portion, and the connecting portion to be readily formed.

In the above actuator according to the aspect of the invention, a groove having a V-like shape in a cross-sectional view taken along a plane perpendicular to plate surfaces of the movable portion is preferably formed in the side surface of the movable portion.

The moment of inertia of the movable portion can therefore be reduced. Further, the groove described above can be readily formed by anisotropically etching a silicon substrate having silicon (100) plate surfaces and using the silicon (111) surface as an etching stop layer to reduce variation in the shape of the groove.

In the actuator according to the aspect of the invention, surfaces of the connecting portion are preferably formed of the silicon (100) surface and the silicon (111) surface.

The configuration described above allows variation in the shape of the connecting portion to be reduced and the connecting portion to be readily formed by using the silicon (111) surface as an etching stop layer.

In the actuator according to the aspect of the invention, the movable portion preferably has a shape symmetric with respect to the swing axis in the plan view.

The symmetric shape of the movable portion allows the center of gravity thereof to be positioned on the swing axis thereof, whereby the movable portion smoothly pivots.

In the above actuator according to the aspect of the invention, the movable portion preferably has a shape symmetric with respect to a line passing through a center of the movable portion and perpendicular to the swing axis in the plan view.

The movable portion can therefore be readily designed.

Another aspect of the invention is directed to an actuator including a movable portion that swings about a swing axis, a connecting portion that extends from the movable portion and torsionally deforms in response to the swinging of the movable portion, and a support portion that supports the connecting portion, wherein the movable portion has a rectangular outer shape having sides formed of line segments parallel to the swing axis, sides formed of line segments perpendicular to the swing axis, and four truncated corners in a plan view, each of the truncated portions having a stepped outer shape obtained by alternately connecting a line segment parallel to the swing axis and a line segment perpendicular to the swing axis, and the movable portion, the support portion, and the connecting portion are formed by anisotropically etching a silicon substrate.

The actuator according to the aspect of the invention includes a movable portion manufacturable with a small amount of variation in the shape thereof and having a small moment of inertia at the time of the swinging.

Still another aspect of the invention is directed to an actuator including a movable portion that swings about a swing axis, a connecting portion that extends from the movable portion and torsionally deforms in response to the swinging of the movable portion, and a support portion that supports the connecting portion, wherein the movable portion has a stepped outer shape having a plurality of angled portions at each of four corners in a plan view, and the movable portion, the support portion, and the connecting portion are formed by anisotropically etching a silicon substrate.

The actuator according to the aspect of the invention includes a movable portion manufacturable with a small amount of variation in the shape thereof and having a small moment of inertia at the time of the swinging.

Yet another aspect of the invention is directed to an optical scanner including a movable portion that includes a light reflector having light reflectivity and swings about a swing axis, a connecting portion that extends from the movable portion and torsionally deforms in response to the swinging of the movable portion, and a support portion that supports the connecting portion, wherein the movable portion is so shaped that the length thereof parallel to the swing axis decreases stepwise with distance from the swing axis in a plan view, and the movable portion, the support portion, and the connecting portion are formed by anisotropically etching a silicon substrate.

The thus configured optical scanner includes a movable portion manufacturable with a small amount of variation in the shape thereof and having a small moment of inertia at the time of the swinging.

Still yet another aspect of the invention is directed to an optical scanner including a movable portion that includes a light reflector having light reflectivity and swings about a swing axis, a connecting portion that extends from the movable portion and torsionally deforms in response to the swinging of the movable portion, and a support portion that supports the connecting portion, wherein the movable portion has a rectangular outer shape having sides formed of line segments parallel to the swing axis, sides formed of line segments perpendicular to the swing axis, and four truncated corners in a plan view, each of the truncated portions having a stepped outer shape obtained by alternately connecting a line segment parallel to the swing axis and a line segment perpendicular to the swing axis, and the movable portion, the support portion, and the connecting portion are formed by anisotropically etching a silicon substrate.

The thus configured optical scanner includes a movable portion manufacturable with a small amount of variation in the shape thereof and having a small moment of inertia at the time of the swinging.

Further another aspect of the invention is directed to an optical scanner including a movable portion that includes a light reflector having light reflectivity and swings about a swing axis, a connecting portion that extends from the movable portion and torsionally deforms in response to the swinging of the movable portion, and a support portion that supports the connecting portion, wherein the movable portion has a stepped outer shape having a plurality of angled portions at each of four corners in a plan view, and the movable portion, the support portion, and the connecting portion are formed by anisotropically etching a silicon substrate.

The thus configured optical scanner includes a movable portion manufacturable with a small amount of variation in the shape thereof and having a small moment of inertia at the time of the swinging.

Still further another aspect of the invention is directed to an image forming apparatus including a light source that emits light, and an optical scanner that deflects light from the light source, wherein the optical scanner includes a movable portion that includes a light reflector having light reflectivity and swings about a swing axis, a connecting portion that extends from the movable portion and torsionally deforms in response to the swinging of the movable portion, and a support portion that supports the connecting portion, the movable portion is so shaped that the length thereof parallel to the swing axis decreases stepwise with distance from the swing axis in a plan view, and the movable portion, the support portion, and the connecting portion are formed by anisotropically etching a silicon substrate.

The thus configured image forming apparatus includes a movable portion manufacturable with a small amount of variation in the shape thereof and having a small moment of inertia at the time of the swinging, whereby a high-quality image can be produced at a low cost.

Yet further another aspect of the invention is directed to an image forming apparatus including a light source that emits light, and an optical scanner that deflects light from the light source, wherein the optical scanner includes a movable portion including a light reflector having light reflectivity and swings about a swing axis, a connecting portion that extends from the movable portion and torsionally deforms in response to the swinging of the movable portion, and a support portion that supports the connecting portion, the movable portion has a rectangular outer shape having sides formed of line segments parallel to the swing axis, sides formed of line segments perpendicular to the swing axis, and four truncated corners in a plan view, each of the truncated portions having a stepped outer shape obtained by alternately connecting a line segment parallel to the swing axis and a line segment perpendicular to the swing axis, and the movable portion, the support portion, and the connecting portion are formed by anisotropically etching a silicon substrate.

The thus configured image forming apparatus includes a movable portion manufacturable with a small amount of variation in the shape thereof and having a small moment of inertia at the time of the swinging, whereby a high-quality image can be produced at a low cost.

Still yet further another aspect of the invention is directed to an image forming apparatus including a light source that emits light, and an optical scanner that deflects light from the light source, wherein the optical scanner includes a movable portion that includes a light reflector having light reflectivity and swings about a swing axis, a connecting portion that extends from the movable portion and torsionally deforms in response to the swinging of the movable portion, and a support portion that supports the connecting portion, the movable portion has a stepped outer shape having a plurality of angled portions at each of four corners in a plan view, and the movable portion, the support portion, and the connecting portion are formed by anisotropically etching a silicon substrate.

The thus configured image forming apparatus includes a movable portion manufacturable with a small amount of variation in the shape thereof and having a small moment of inertia at the time of the swinging, whereby a high-quality image can be produced at a low cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

An actuator, an optical scanner, and an image forming apparatus according to preferred embodiments of the invention will be described below with reference to the accompanying drawings. The following description will be made with reference to a case where the actuator according to each of the preferred embodiments of the invention is used as an optical scanner.

First Embodiment

An optical scanner according to a first embodiment of the invention will first be described.

Figure 1:
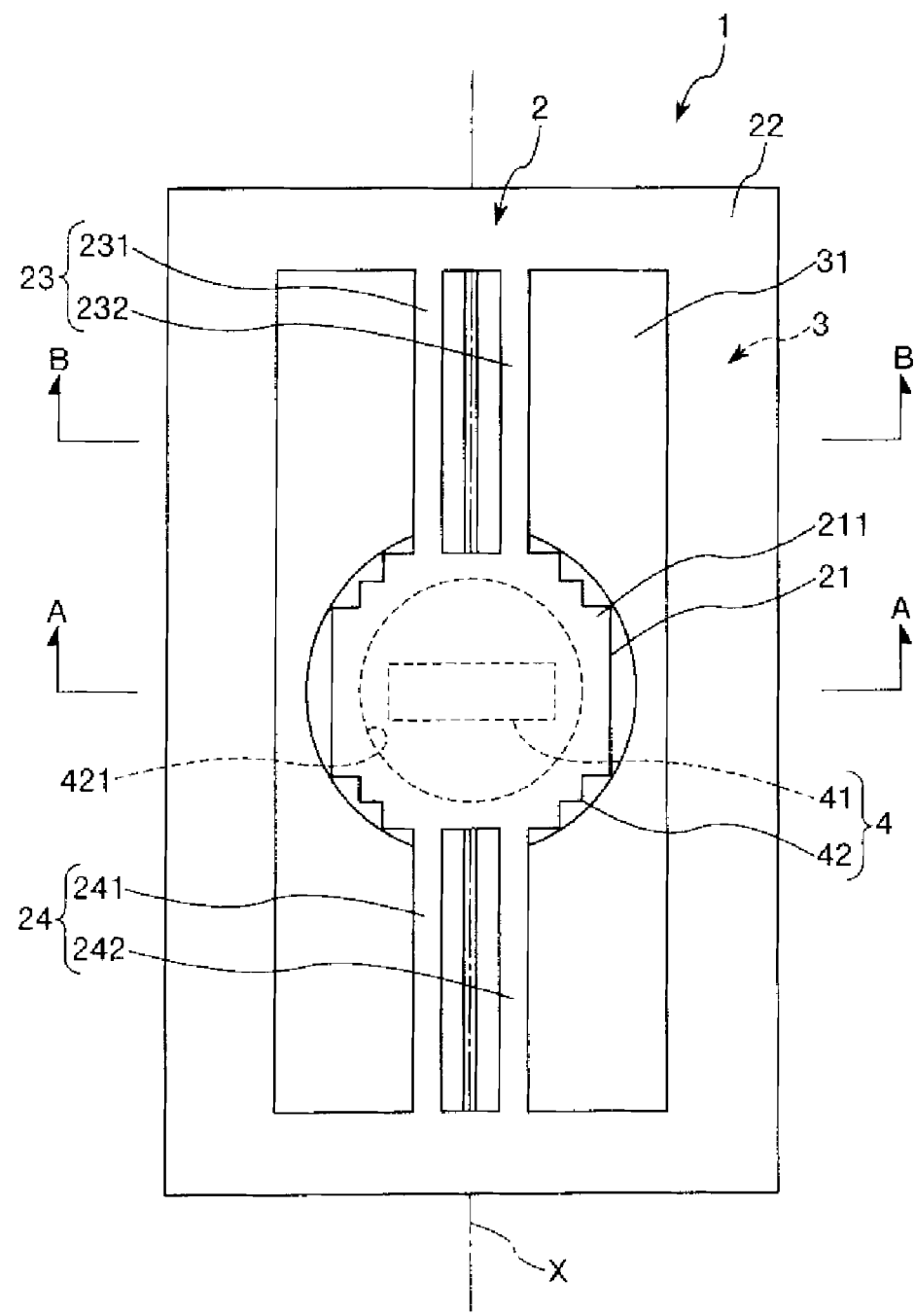
FIG. 1 is a plan view showing an optical scanner (actuator) according to a first embodiment of the invention.
Figure 2:
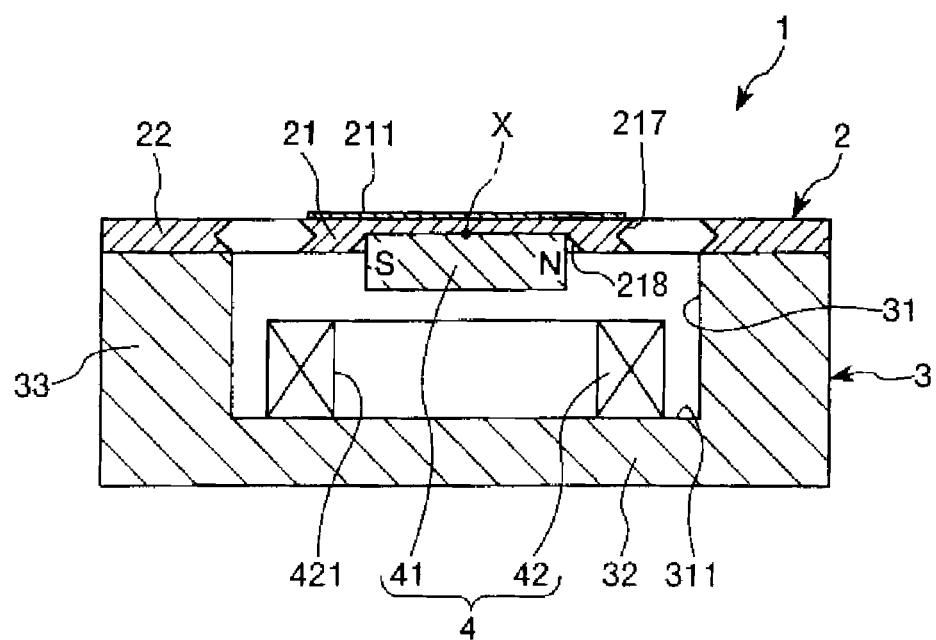
FIG. 2 is a cross-sectional view taken along the line A-A shown in FIG. 1.
Figure 3:
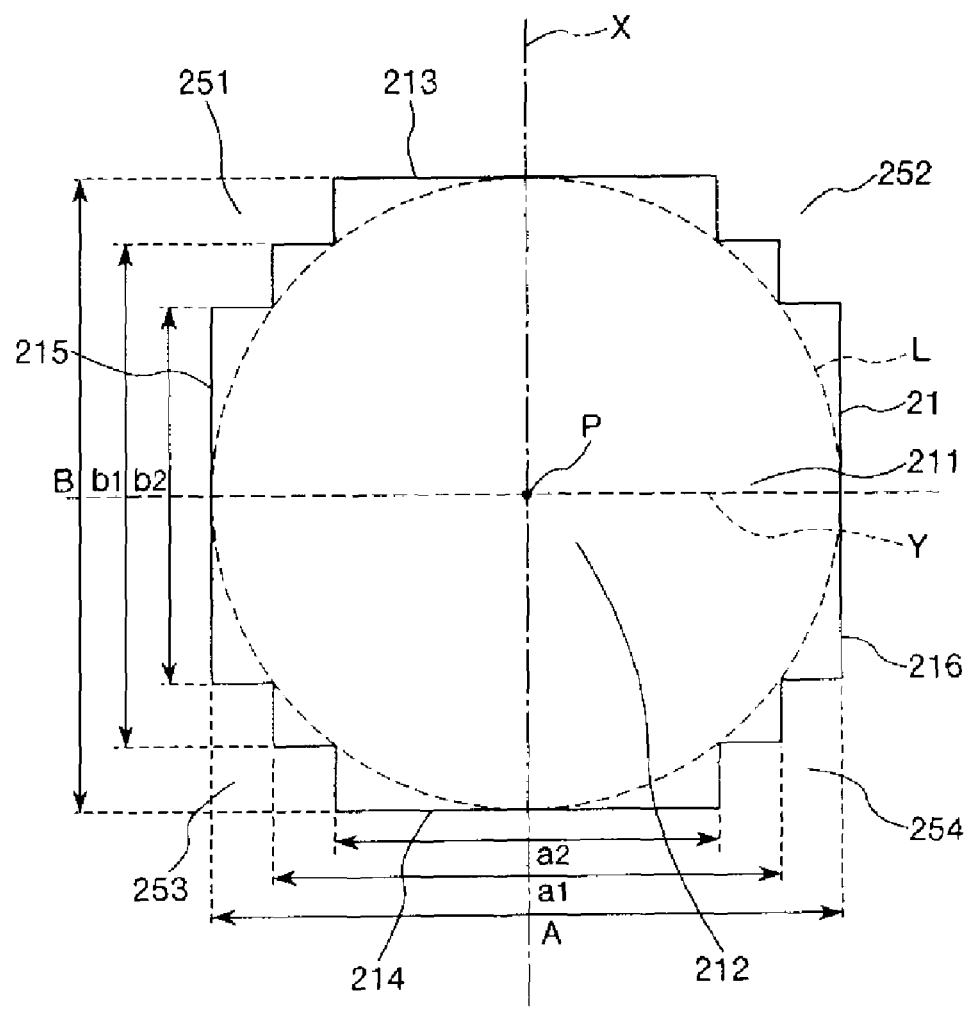
FIG. 3 is a plan view for describing a movable plate provided in the optical scanner shown in FIG. 1.
Figure 4:
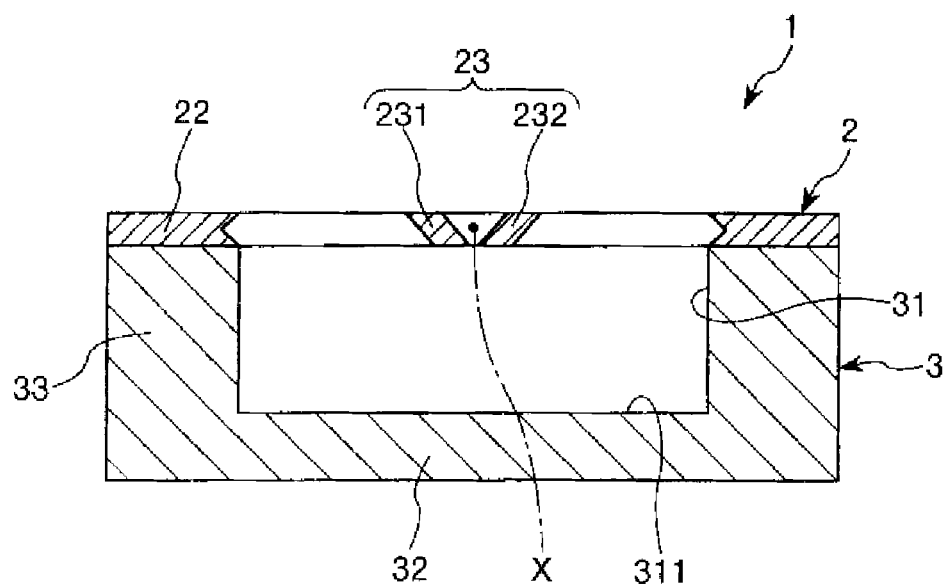
FIG. 4 is a cross-sectional view taken along the line B-B shown in FIG. 1.
Figure 5:
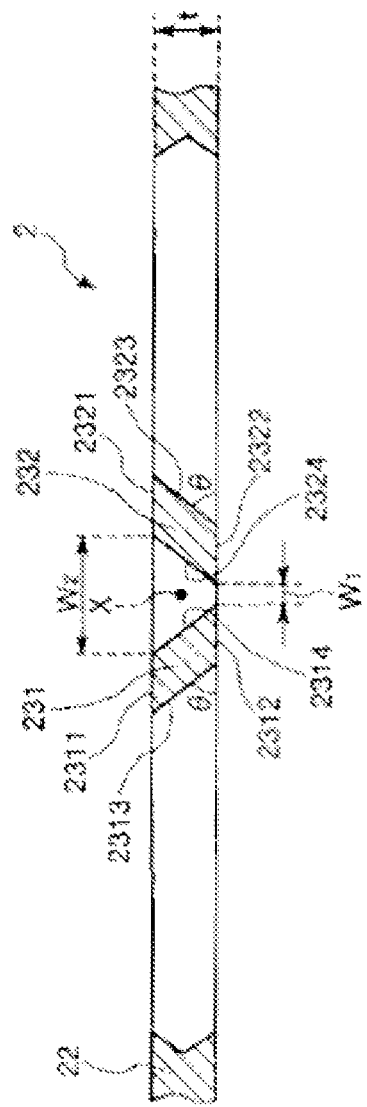
FIG. 5 is a partial enlarged cross-sectional view showing part of FIG. 4.

FIG. 1 is a plan view showing the optical scanner (actuator) according to the first embodiment of the invention. FIG. 2 is a cross-sectional view taken along the line A-A shown in FIG. 1. FIG. 3 is a plan view for describing a movable plate provided in the optical scanner shown in FIG. 1. FIG. 4 is a cross-sectional view taken along the line B-B shown in FIG. 1. FIG. 5 is a partial enlarged cross-sectional view showing part of FIG. 4. In the following sections, the upper side and the lower side in FIGS. 2 and 4, 5, 6A to 6G, 7A to 7G, and 8A to 8G are referred to as "up" and "down," respectively, for ease of description.

An optical scanner 1 includes a base 2 having an oscillatory system, a support 3 that supports the base 2, and a driver 4 that oscillates the oscillatory system of the base 2, as shown in FIG. 1.

The base 2 includes a movable plate (movable portion) 21 having a light reflector 211 provided thereon, a pair of connecting portions 23 and 24 connected to the movable plate 21, and a support portion 22 that supports the pair of connecting portions 23 and 24. In other words, the support portion 22 supports the movable plate 21 via the connecting portions 23 and 24, and the pair of connecting portions 23 and 24 connect the movable plate 21 to the support portion 22.

In the thus configured optical scanner 1, the driver 4 produces a drive force that causes the movable plate 21 to pivot (swing) about a predetermined axis (pivotal central axis) extending along the connecting portions 23 and 24 with the connecting portions 23 and 24 torsionally deformed. Light reflected off the light reflector 211 is thus deflected along a single predetermined direction.

The components that form the optical scanner 1 will be sequentially described below in detail.

Base

The base 2 includes the movable plate 21, on which the light reflector 211 is provided, the support portion 22, which supports the movable plate 21, and the pair of connecting portions 23 and 24, which connect the movable plate 21 to the support portion 22, as described above.

The base 2 is primarily made of silicon, and the movable plate 21, the support portion 22, and the connecting portions 23 and 24 are formed integrally with each other. More specifically, the base 2 is formed by anisotropically etching a silicon substrate having silicon (100) plate surfaces, as will be described later in detail. When anisotropic etching is performed as described above, a silicon (111) surface works as an etching stop layer, whereby the movable plate 21, the support portion 22, and the pair of connecting portions 23 and 24 can be readily formed with precision. The silicon substrate is typically formed of a single crystal silicon substrate.

Each of the upper and lower surfaces of the base 2 is the silicon (100) surface, and each of the inner circumferential surface of the support portion 22, the side surface of the movable plate 21, and the side surfaces of the connecting portions 23 and 24 that are parallel to an axial line X is the silicon (111) surface.

Since silicon is as light and rigid as SUS, the base 2 primarily made of silicon has excellent oscillation characteristics. Further, since silicon can be etched with high dimensional precision, as will be described later, the base 2 formed of a silicon substrate can be etched into a desired shape (shaped to have desired oscillation characteristics).

The base 2 will be further described below in detail.

The support portion 22 has a frame-like shape, as shown in FIG. 1. More specifically, the support portion 22 has an annularly rectangular shape. The thus shaped support portion 22 supports the movable plate 21 via the pair of connecting portions 23 and 24. The shape of the support portion 22 is not limited to a specific one and may be any shape that can support the movable plate 21 via the pair of connecting portions 23 and 24. For example, the support portion 22 may be divided in correspondence with the connecting portions 23 and 24.

The movable plate 21 is disposed inside the thus shaped support portion 22.

The movable plate 21 has a plate-like shape. In the present embodiment, the movable plate 21 has an outer shape having stepped four corners about the center P of the movable plate 21 in a plan view along the thickness direction thereof. Each of the stepped outer portions includes a plurality of angled portions, five angled portions per corner in the present embodiment. The shape of the movable plate 21 not only ensures a sufficient area (light reflecting region) of the light reflector 211 on the upper surface of the movable plate 21 but also reduces the moment of inertia of the movable plate 21 at the time of pivotal motion. Further, the thus shaped movable plate 21 can be readily formed with precision by anisotropically etching a silicon substrate, as will be described later in detail.

In other words, the movable plate 21 has a rectangular outer shape having sides formed of line segments parallel to the pivotal central axis (swing axis, axial line X), sides formed of line segments perpendicular to the pivotal central axis, and four truncated corners in a plan view along the thickness direction. Each of the truncated portions (251, 252, 253, and 254) has a stepped outer shape obtained by alternately connecting a line segment parallel to the pivotal central axis and a line segment perpendicular thereto.

In still other words, the movable plate 21 is so shaped that the length (width) thereof parallel to the pivotal central axis (axial line X) decreases stepwise with distance from the axial line X in the plan view viewed along the thickness direction. The terms "stepwise" and "continuously" used herein are expressions having opposite meanings, and the former means that the length (width) of the movable plate 21 discretely changes in the present embodiment.

The outer edge of the movable plate 21 can thus be as similar as possible to the outer edge of the spot of light L incident on the light reflector 211, whereby the light reflecting region of the movable plate 21 can be efficiently ensured.

More specifically, the movable plate 21 includes a main body 212, a pair of protrusions (second protrusions) 213 and 214 that protrude from the main body 212 in opposite directions parallel to the axial line X, and a pair of protrusions (first protrusions) 215 and 216 that protrude from the main body 212 in opposite directions perpendicular to the axial line X, as shown in FIG. 3.

The truncated portion 251 is formed between the protrusion 213 and the protrusion 215 along the outer edge of the movable plate 21. Similarly, the truncated portion 252 is formed between the protrusion 213 and the protrusion 216 along the outer edge of the movable plate 21. The truncated portion 254 is formed between the protrusion 214 and the protrusion 216 along the outer edge of the movable plate 21. The truncated portion 253 is formed between the protrusion 214 and the protrusion 215 along the outer edge of the movable plate 21.

In other words, the truncated portion 251, the protrusion 213, the truncated portion 252, the protrusion 216, the truncated portion 254, the protrusion 214, the truncated portion 253, and the protrusion 215 are arranged in this order along the outer edge of the movable plate 21 (main body 212) in a plan view.

Further, the truncated portion 251 and the truncated portion 252 face each other with the protrusion 213 therebetween. The truncated portion 252 and the truncated portion 254 face each other with the protrusion 216 therebetween. The truncated portion 253 and the truncated portion 254 face each other with the protrusion 214 therebetween. The truncated portion 251 and the truncated portion 253 face each other with the protrusion 215 therebetween.

The movable plate 21 at each of truncated portions 251 to 254 has a stepped outer shape alternately extending in the direction perpendicular to the pivotal central axis of the movable plate 21 (hereinafter also referred to as "along line Y") and in the direction parallel to the pivotal central axis (axial line X) of the movable plate 21 (hereinafter also referred to as "along axial line X") in the plan view along the thickness direction.

The movable plate 21 thus has a rectangular outer shape having sides formed of line segments parallel to the pivotal central axis, sides formed of line segments perpendicular thereto, and four truncated corners in the plan view along the thickness direction, and each of the truncated portions has a stepped outer shape obtained by alternately connecting a line segment parallel to the pivotal central axis and a line segment perpendicular thereto, as described above.

The movable plate 21 is therefore so shaped that the length (width) along the axial line X decreases stepwise with distance from the center toward both ends along the line Y in the plan view viewed along the thickness direction. Further, the movable plate 21 is so shaped that the length (width) along the line Y decreases stepwise with distance from the center toward both ends along the axial line X direction in the plan view viewed along the thickness direction.

Each of the angled portions at each of the stepped outer portions of the movable plate 21 described above may not have an exact right angle in some cases because a plurality of crystal surfaces are present. Further, the angled portions described above may be rounded in a rounding process. In the present embodiment, each of the corners is considered to have the stepped shape described above even when each angled portion does not have an exact right angle or is rounded, and the length (width) of the movable plate 21 is considered to change stepwise.

In the present embodiment, each of the four corners of the movable plate 21 has a two-step stepped shape in the plan view along the thickness direction. In other words, the length (width) of the movable plate 21 along the axial line X decreases stepwise in two steps with distance from the center toward both ends along the line Y in the plan view viewed along the thickness direction. As a result, the length (width) of the movable plate 21 along the axial line X has three values. The length (width) of the movable plate 21 along the line Y also decreases stepwise in two steps with distance from the center toward both ends along the axial line X in the plan view viewed along the thickness direction. As a result, the length (width) of the movable plate 21 along the line Y has three values. The thus shaped movable plate 21 has an area and a thickness that allow the movable plate 21 to pivot at a resonance frequency (ranging from 4 to 40 kHz), which is suitable for optical scanning, with dynamic distortion suppressed.

Each of the protrusions 213 and 214 of the thus shaped movable plate 21 has a width a2 along the line Y direction, which is smaller than a width a1 of the main body 212 along the line Y. Further, each of the protrusions 215 and 216 has a width b2 along the axial line X, which is smaller than a width b1 of the main body 212 along the axial line X.

In the present embodiment, a1 and b1 are equal to each other and a2 and b2 are equal to each other. Alternatively, a1 and b1 may differ from each other and a2 and b2 may differ from each other.

The outer shape of the movable plate 21 in the plan view along the thickness direction is primarily formed of line segments parallel to the pivotal central axis (axial line X) of the movable plate 21 and line segments perpendicular to the pivotal central axis (axial line X) of the movable plate 21 (line segments Y). The movable plate 21 having the outer shape described above can be readily formed with precision by anisotropically etching a silicon substrate, as will be described later. Each of the angled portions at each of the stepped outer portion of the movable plate 21 is formed of not only a predetermined crystal surface but also a plurality of crystal surfaces. The outer shape of each of the angled portions and portions therearound of the movable plate 21 in the plan view along the thickness direction may therefore not always have line segments parallel to the axial line X or the line Y in some cases. That is, the outer shape of the movable plate 21 in the plan view along the thickness direction is formed of line segments parallel to the axial line X and line segments parallel to the line Y except at least the angled portions of the movable plate 21 described above.

Further, the movable plate 21 has a symmetric shape with respect to the pivotal central axis (axial line X) of the movable plate 21 in a plan view. The symmetric shape of the movable plate 21 readily allows the center of gravity of the movable plate 21 to be positioned on the pivotal central axis of the movable plate 21, whereby the movable plate 21 can smoothly pivot.

The movable plate 21 also has a symmetric shape with respect to the line Y, which passes through the center P of the movable plate 21 and is perpendicular to the pivotal central axis (axial line X) of the movable plate 21 in a plan view. The movable plate is therefore readily designed.

Further, each of the plate surfaces (upper and lower surfaces) of the movable plate 21 is formed of the silicon (100) surface. The movable plate 21, the support portion 22, and the pair of connecting portions 23 and 24 can therefore be readily formed with precision by anisotropically etching a silicon substrate having silicon (100) plate surfaces, as will be described later.

The side surfaces of the movable plate 21 (surfaces parallel to axial line X, in particular) are formed primarily of the silicon (111) surface. The movable plate 21, the support portion 22, and the pair of connecting portions 23 and 24 can therefore be readily formed with precision by anisotropically etching a silicon substrate having silicon (100) plate surfaces and using the silicon (111) surface as an etching stop layer, as will be described later. The side surfaces of the angled portions of the stepped outer shape of the movable plate 21 in the plan view along the thickness direction of the movable plate 21 are formed of the (111) surface and other crystal surfaces. The side surfaces of the movable plate 21 are therefore formed only of the silicon (111) surface except at least the side surfaces of the angled portions described above.

A groove 217 having a V-like shape in a transverse cross section perpendicular to the plate surfaces of the movable plate 21 is formed in each of the side surfaces of the movable plate 21. The groove 217 reduces the moment of inertia of the movable plate 21. The groove can be readily formed with precision by anisotropically etching a silicon substrate having silicon (100) plate surfaces and using the silicon (111) surface as an etching stop layer.

Now, let A be the length of the movable plate 21 along the line Y and B be the length of the movable plate 21 along the axial line X. The lengths A and B are equal to each other in the present embodiment but may differ from each other. When the lengths of A and B differ from each other, A/B preferably ranges from about 0.8 to 1.2 from the viewpoint of efficiently ensuring the light reflecting region.

In the present embodiment, the following relationships are satisfied: A>a1>a2 and B>b1>b2.

The lengths A and B are determined in accordance with the diameter and shape of the spot of light to be used and other factors. The lengths A and B are not limited to specific ones but are, for example, greater than or equal to 1.0 mm but smaller than or equal to 2.5 mm.

The thickness of the movable plate 21 is not limited to a specific value but is preferably greater than or equal to 60 μm but smaller than or equal to 600 μm, more preferably greater than or equal to 200 μm but smaller than or equal to 600 μm when A and B fall within the range described above from the viewpoint of keeping the dynamic distortion at the time of pivotal motion of the movable plate 21 at a value smaller than or equal to the wavelength λ of the light L. In the present embodiment, the thickness of the movable plate 21 is equal to the thickness t of a pair of beam members 231 and 232 and the thickness T of a silicon substrate 102A, which will be described later.

The light reflector 211 having optical reflectivity is provided on the upper surface of the movable plate 21. On the other hand, a permanent magnet 41 that forms the driver 4, which will be described later, is provided on the lower surface of the movable plate 21. The permanent magnet 41 will be described in detail in association with the description of the driver 4, which will be described later.

Each of the connecting portions 23 and 24 has an elongated shape and is elastically deformable. Further, the connecting portion 23 and the connecting portion 24 are disposed on opposite sides of the movable plate 21. The connecting portions 23 and 24 connect the movable plate 21 to the support portion 22 in such a way that the movable plate 21 is pivotal relative to the support portion 22. The pair of connecting portions 23 and 24 are coaxially disposed along the axial line X, and the movable plate 21 pivots relative to the support portion 22 about the axial line X, which serves as the pivotal central axis.

In the present embodiment, the connecting portion 23 is formed of a pair of beam members 231 and 232, as shown in FIG. 1. Similarly, the connecting portion 24 is formed of a pair of beam members 241 and 242.

The thus configured connecting portions 23 and 24 can reduce stress induced between the connecting portions 23, 24 and the movable plate 21 at the time of pivotal motion of the movable plate 21. The connecting portion 23 will be described below as a representative one of the connecting portions 23 and 24, and the connecting portion 24 will not be described because it is identical with the connecting portion 23.

The beam members 231 and 232 are disposed along the axial line X and face each other with the axial line X therebetween. Further, each of the beam members 231 and 232 has a parallelogram transverse cross-sectional shape.

More specifically, each of the beam members 231 and 232 has a parallelogram outer transverse cross-sectional shape formed of a pair of sides extending in the silicon (100) surface and a pair of sides extending in the silicon (111) surface. That is, the beam member 231 has an upper surface 2311 and a lower surface 2312, each of which is formed of the silicon (100) surface, and a pair of side surfaces 2313 and 2314, each of which is formed of the silicon (111) surface. Similarly, the beam member 232 has an upper surface 2321 and a lower surface 2322, each of which is formed of the silicon (100) surface, and a pair of side surfaces 2323 and 2324, each of which is formed of the silicon (111) surface. Since each of the side surfaces 2313, 2314, 2323, and 2324 is formed of the silicon (111) surface, the inclination angle θ of each of the side surfaces with respect to the upper or lower surface of the base 2 (that is, silicon (100) surface) is 54.73°. The beam members 231 and 232, each of which has the transverse cross-sectional shape described above, can be readily and reliably formed by anisotropically etching a silicon substrate having silicon (100) plate surfaces.

The connecting portion 23, the outer surfaces of which are formed of the silicon (100) surface and the silicon (111) surface, can be readily formed with precision by using the silicon (111) surface as an etching stop layer, as will be described later.

Further, the beam members 231 and 232, when viewed in the direction parallel to the axial line X (in other words, in the cross-sectional view of FIG. 5), are symmetric with respect to a line that extends in the up-down direction and intersects the axial line X.

Further, the width of the entire connecting portion 23 (inter-surface distance between side surface 2313 of beam member 231 and side surface 2323 of beam member 232) (gradually) increases in the direction from the lower side toward the upper side, as shown in the cross-sectional view of FIG. 5. The width of the entire connecting portion 23 is the width measured when the connecting portion 23 formed of the beam members 231 and 232 is taken as a single member, and the width is the distance between the two surfaces that form the connecting portion 23 and are most remote from the pivotal central axis in the direction perpendicular thereto.

The distance between the beam member 231 and the beam member 232 (width of the gap therebetween) also (gradually) increases in the direction from the lower side toward the upper side, as shown in the cross-sectional view of FIG. 5. The distance between the beam member 231 and the beam member 232 is the distance between the surface of the beam member 231 (side surface 2314) and the surface of the beam member 232 (side surface 2324) that face each other with the pivotal central axis therebetween, in the direction parallel to the plate surface of the movable plate 21.

That is, the distance between the pair of beam members 231 and 232, when viewed in the direction parallel to the pivotal central axis of the movable plate 21, gradually increases in the direction from one of the plate surfaces toward the other plate surface of the movable plate 21 (from the lower side toward the upper side in the present embodiment).

The thus configured connecting portion 23 can be readily formed with precision at the same time as the formation of the movable plate 21 having the shape in a plan view described above by anisotropically etching a silicon substrate, as will be described later.

Now, let $W_1$ be the distance between the lower ends of the pair of beam members 231 and 232 and t be the thickness of the pair of beam members 231 and 232 in the thickness direction of the movable plate 21. The two values satisfy the following Expression (1).

$$W_1 < \frac{t}{\tan 54.73°} \quad (1)$$

To anisotropically etch opposite surfaces of a silicon substrate having silicon (100) plate surfaces, a mask is formed on each of the opposite surfaces of the silicon substrate before the movable plate 21, the support portion 22, and the pair of connecting portions 23 and 24 are formed, as will be described later in detail. In this process, the positions where the masks are formed are shifted from each other in some cases. When the positions where the masks are formed on the opposite surfaces of the silicon substrate are shifted from each other, steps are disadvantageously formed on the pair of side surfaces 2313 and 2314 and the pair of side surfaces 2323 and 2324, which are preferably formed by the silicon (111) surfaces, of the beam members 231 and 232. When the positions where the masks are formed on the opposite surfaces of the silicon substrate are shifted from each other but Expression (1) described above is satisfied, the step formed on one of each of the pairs of side surfaces and the step formed on the other side surface of the pair of side surfaces can be shifted in the thickness direction of the silicon substrate (see FIG. 12D). As a result, stress concentration in each of the beam members 231 and 232 that occurs at the time of pivotal motion of the movable plate 21 can be reduced.

Possible damage to the optical scanner 1 due to stress concentration that occurs when the optical scanner 1 is driven can thus be relatively readily prevented.

Further, let $W_2$ be the distance between the upper ends of the pair of beam members 231 and 232. The value plus the two values described above satisfy the following Expression (2).

$$t < \frac{\tan 54.73°}{2}(W_1 + W_2) \quad (2)$$

When Expression (2) is satisfied, the connecting portion 23 formed of the pair of beam members 231 and 232 can be readily and reliably formed by anisotropically etching opposite surfaces of a silicon substrate having silicon (100) plate surfaces.

Support

The support 3 supports the base 2 described above. The support 3 also supports a coil 42 that form the driver 4, which will be described later.

The support 3 has a box-like shape having a recess 31 open upward. In other words, the supports 3 is formed of a plate-shaped portion 32 having a plate-like shape and a frame-shaped portion 33 having a frame-like shape and provided along the periphery of the upper surface of the plate-shaped portion 32.

The lower surface of the support portion 22 of the base 2 described above is bonded to the upper surface of the support 3, which is the portion outside the recess 31, that is, the upper surface of the frame-shaped portion 33. A space that allows the movable plate 21 to pivot is thus formed between the movable plate 21/the pair of connecting portions 23, 24 of the base 2 and the support 3.

The material of which the support 3 is made is not limited to a specific one and may, for example, be quartz glass, PYREX glass ("PYREX" is a registered trade mark), TEMPAX glass, or any other glass material; single crystal silicon, polysilicon, or any other silicon material; and LTCC (low-temperature co-fire ceramic).

A method for bonding the base 2 to the support 3, which is determined as appropriate in accordance with the material, the shape, and other factors of the support 3, is not limited to a specific one and may be an adhesive-based method, anodic bonding, direct bonding, or any other suitable method.

Driver

The driver 4, which includes the permanent magnet 41 and the coil 42, causes pivotal motion of the movable plate 21 of the base 2 described above by electromagnetically driving the movable plate 2 (more specifically, based on a moving magnet method). The electromagnetic driving can produce a large drive force. The driver 4 based on the electromagnetic driving can therefore produce a large pivotal angle of the movable plate 21 while using a reduced drive voltage.

The permanent magnet 41 is fixed to the lower surface of the movable plate 21, for example, with an adhesive. Further, the permanent magnet 41 has an elongated shape and extends in the direction perpendicular to the axial line X in a plan view. The permanent magnet 41 is magnetized in the longitudinal direction and has one side in the longitudinal direction being the south pole and the other side being the north pole. When the permanent magnet 41 is so disposed that it extends in the direction perpendicular to the axial line X, both ends of the permanent magnet 41 can be set apart from the axial line X. The arrangement allows the movable plate 21 to receive a large magnitude of torque from the magnetic field induced by the coil 42.

The permanent magnet 41 is not limited to a specific one and can, for example, preferably be a neodymium magnet, a ferrite magnet, a samarium-cobalt magnet, an alnico magnet, a bonded magnet, and any other magnet formed of a magnetized hard magnetic material.

The coil 42 is so disposed on a bottom surface 311 of the recess 31 of the support 3 that the coil 42 faces the movable plate 21. The arrangement allows the magnetic field induced by the coil 42 to effectively act on the permanent magnet 41. The coil 42 is electrically connected to a power supply (not shown), which applies periodically changing voltage (such as AC voltage, intermittent current) to the coil 42.

The thus configured driver 4 causes the movable plate 21 to pivot as follows.

First, the power supply (not shown) applies, for example, an AC voltage to the coil 42. The AC voltage application alternately and periodically induces a first magnetic field in which the upper side of the coil 42 (the side where the movable plate 21 is present) forms the north pole and the lower side of the coil 42 forms the south pole and a second magnetic field in which the upper side of the coil 42 forms the south pole and the lower side of the coil 42 forms the north pole.

In the first magnetic field, the coil 42 attracts the south pole of the permanent magnet 41 whereas repulsing the north pole of the permanent magnet 41, whereby the movable plate 21 pivots about the axial line X counterclockwise in FIG. 2 (first state). In contrast, in the second magnetic field, the coil 42 attracts the north pole of the permanent magnet 41 whereas repulsing the south pole of the permanent magnet 41, whereby the movable plate 21 pivots about the axial line X clockwise in FIG. 2 (second state). The first and second states are alternately repeated, and the movable plate 21 pivots about the axial line X.

Method for Manufacturing Actuator

The optical scanner 1 described above can be manufactured, for example, as follows: As an example of a method for manufacturing an actuator according to an embodiment of the invention, a method for manufacturing the optical scanner 1 will be described with reference to FIGS. 6A to 6G to FIGS. 12A to 12D.

Figure 9:
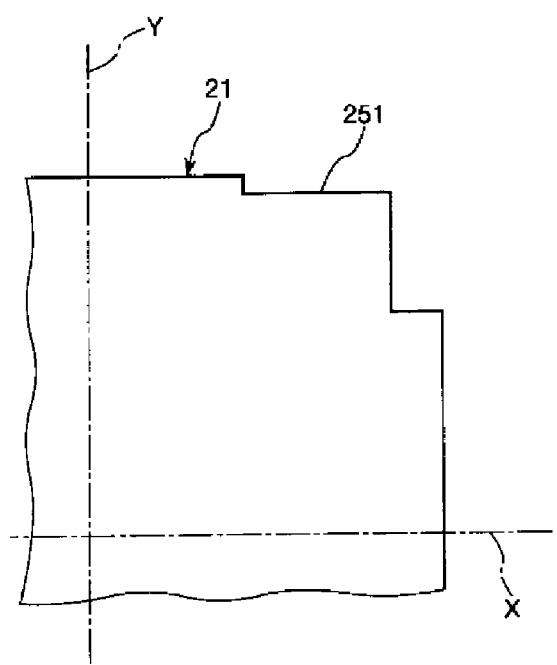
FIG. 9 is a partial enlarged plan view showing the movable plate after an etching step shown in FIG. 8E.
Figure 10:
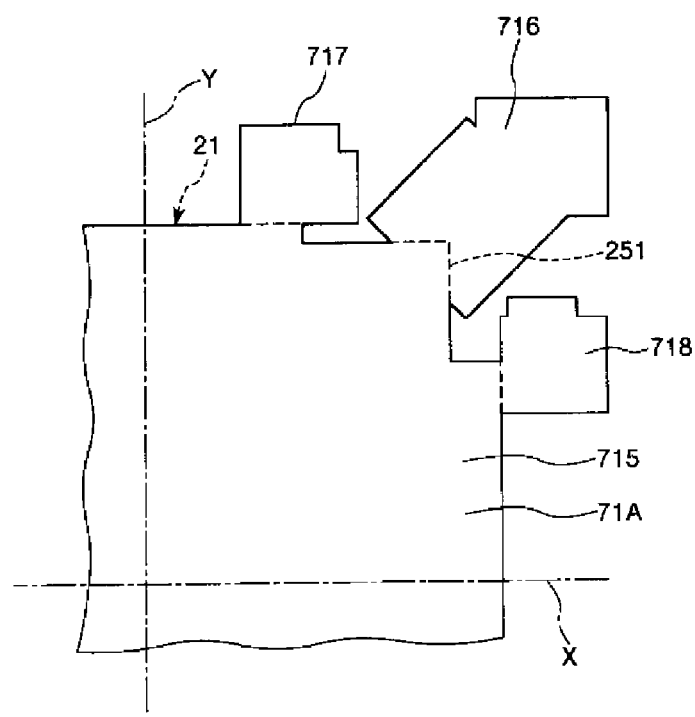
FIG. 10 is a partial enlarged plan view showing a mask used in the etching step shown in FIG. 8E.

FIGS. 6A to 6G to FIGS. 8A to 8G are cross-sectional views for describing the method for manufacturing the optical scanner shown in FIG. 1. FIG. 9 is a partial enlarged plan view showing the movable plate after an etching step shown in FIG. 8E. FIG. 10 is a partial enlarged plan view showing a mask used in the etching step shown in FIG. 8E. FIGS. 11A to 11D describe formation of the connecting portions in the etching step (when no mask shift occurs) shown in FIG. 8E. FIGS. 12A to 12D describe the formation of the connecting portions in the etching step (when mask shift occurs) shown in FIG. 8E. FIGS. 6A to 6G to 8A to 8G are cross-sectional views corresponding to FIG. 2, and FIGS. 11A to 11D and 12A to 12D are cross-sectional views corresponding to FIG. 5.

The method for manufacturing the optical scanner 1 includes the step of forming the base 2.

The step of forming the base 2 includes A: the step of forming a recess 218 and B: the step of forming the movable plate 21, the support portion 22, and the pair of connecting portions 23 and 24.

Each of the steps will be sequentially described below in detail.

A. Step of Forming Recess 218

A1

Figure 6A:
FIGS. 6A to 6G are cross-sectional views for describing a method for manufacturing the optical scanner shown in FIG. 1.

A silicon substrate 102 is first provided, as shown in FIG. 6A.

The silicon substrate 102 will form the base 2 after undergoing etching, which will be described later.

Specifically, the silicon substrate 102 is so configured that each principal surface thereof is the silicon (100) surface.

A2

Figure 6B:
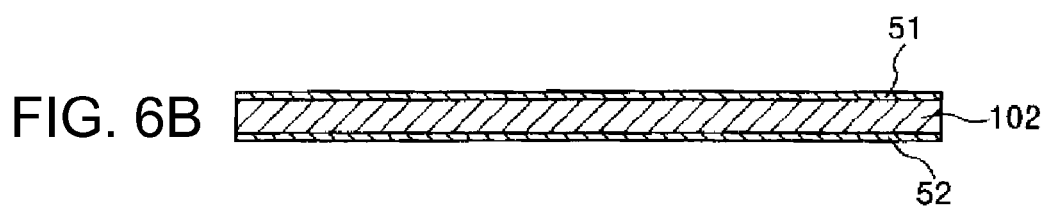

A nitride film 51 is then formed on the upper surface of the silicon substrate 102, and a nitride film 52 is formed on the lower surface of the silicon substrate 102, as shown in FIG. 6B.

Each of the nitride films 51 and 52 is made, for example, of SiN.

A method for forming the nitride films 51 and 52 is not limited to a specific one. For example, vapor deposition, such as plasma CVD, can be used.

The thickness of each of the nitride films 51 and 52 is not limited to a specific value and is greater than or equal to about 0.01 μm but smaller than or equal to about 0.2 μm.

The nitride films 51 and 52 may be replaced with oxide films made of SiO formed, for example, in a thermal oxidation process.

A3

Figure 6C:
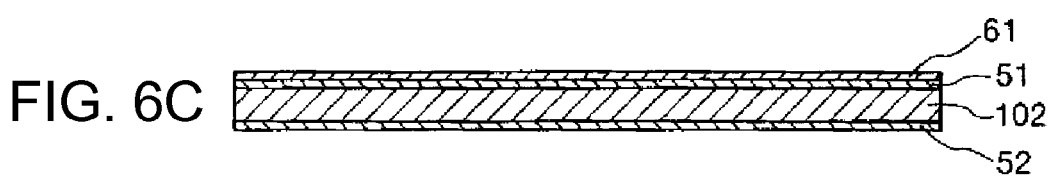
Figure 6D:
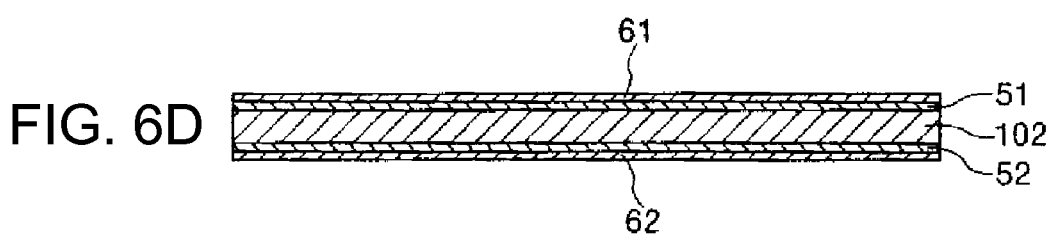

A resist film 61 is then formed on the nitride film 51 as shown in FIG. 6C, and a resist film 62 is formed on the nitride film 52 as shown in FIG. 6D.

The resist films 61 and 62 are made of a positive or negative resist material.

A4

Figure 6E:
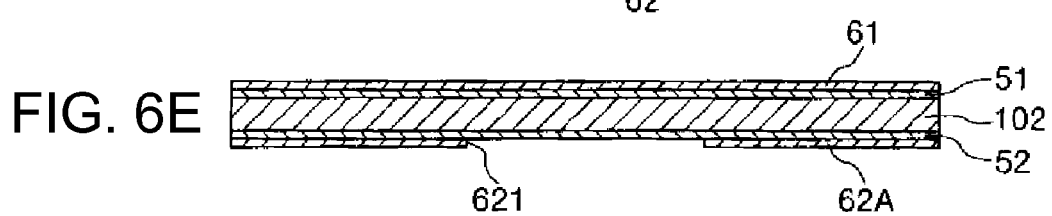

The resist film 62 is then exposed to light and developed to remove a portion of the resist film 62 that corresponds to a region where the recess 218 is formed. A resist film 62A having an opening 621 is thus formed, as shown in FIG. 6E.

A5

Figure 6F:
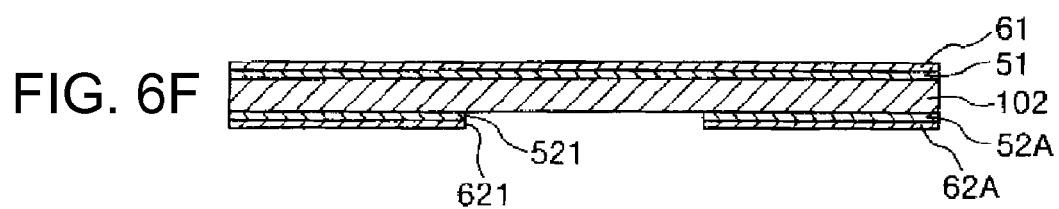

The resist film 62A is then used as a mask to etch away part of the nitride film 52. A nitride film 52A having an opening 521 is thus formed, as shown in FIG. 6F.

The etching described above (method for forming opening 521) is not limited to a specific one and may, for example, be reactive ion etching (RIE) or dry etching using $CF_4$.

A6

Figure 6G:
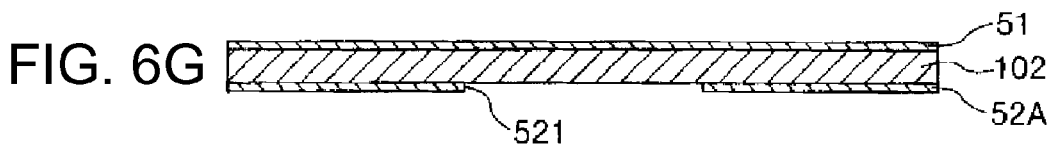

The resist films 61 and 62A are then removed. The removal of the resist films leaves the upper surface of the silicon substrate 102 covered with the nitride film 51 and the lower surface of the silicon substrate 102 covered with the nitride film 52A, as shown in FIG. 6G.

A method for removing the resist films 61 and 62A is not limited to a specific one and may, for example, be sulfuric-acid washing or $O_2$ ashing.

Figure 7A:
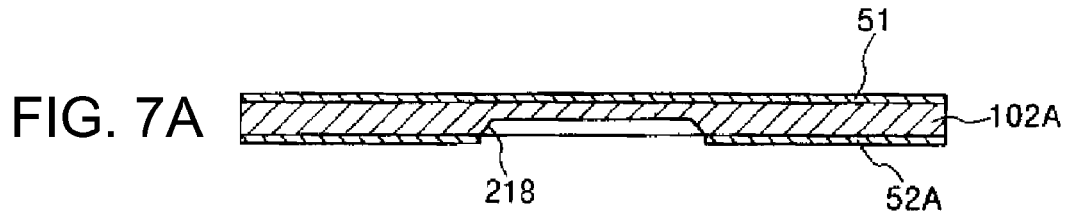
FIGS. 7A to 7G are cross-sectional views for describing the method for manufacturing the optical scanner shown in FIG. 1.

The nitride film 52A is then used as a mask to etch the silicon substrate 102. A silicon substrate 102A having the recess 218 is thus formed, as shown in FIG. 7A.

The etching described above (method for forming recess 218) is not limited to a specific one and anisotropic etching is preferably used, as in an etching process of forming the movable plate 21, the support portion 22, and other components, which will be described later.

The anisotropic etching is not limited to a specific one and wet etching, for example, using a KOH aqueous solution can, for example, be used.

A8

Figure 7B:
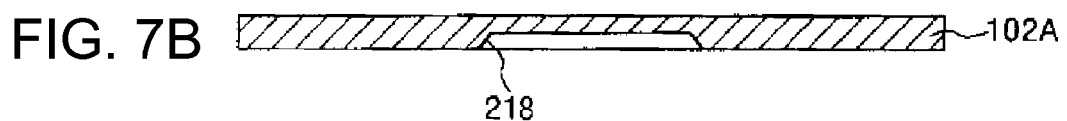

The nitride films 51 and 52A are then removed. The removal of the nitride films allows the upper and lower surfaces of the silicon substrate 102A to be exposed, as shown in FIG. 7B.

A method for removing the nitride films 51 and 52A is not limited to a specific one and may, for example, be reactive ion etching (RIE) or dry etching using $CF_4$, as in step A5 described above.

B. Step of Forming Movable Plate 21, Support Portion 22, and Other Components

B1

Figure 7C:
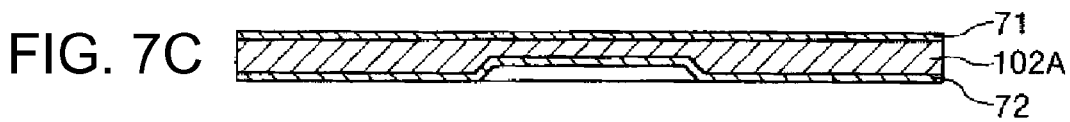

A nitride film 71 is then formed on the upper surface of the silicon substrate 102A, and a nitride film 72 is formed on the lower surface of the silicon substrate 102A, as shown in FIG. 7C.

The nitride films 71 and 72 are made, for example, of SiN.

A method for forming the nitride films 71 and 72 is not limited to a specific one. For example, vapor deposition, such as plasma CVD, can be used, as in step A2 described above.

The thickness of each of the nitride films 71 and 72 is not limited to a specific value and is greater than or equal to about 0.01 µm but smaller than or equal to about 0.3 µm.

The nitride films 71 and 72 may be replaced with oxide films made of SiO formed, for example, in a thermal oxidation process.

B2

Figure 7D:
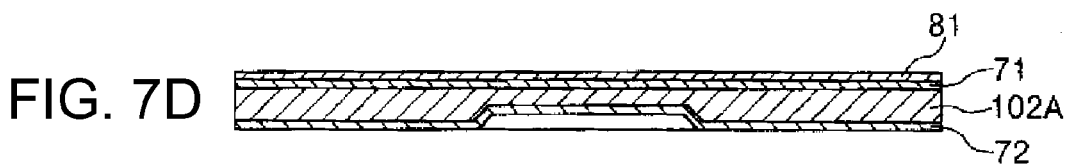

A resist film 81 is then formed on the nitride film 71 as shown in FIG. 7D.

The resist film 81 is made of a positive or negative resist material.

B3

Figure 7E:
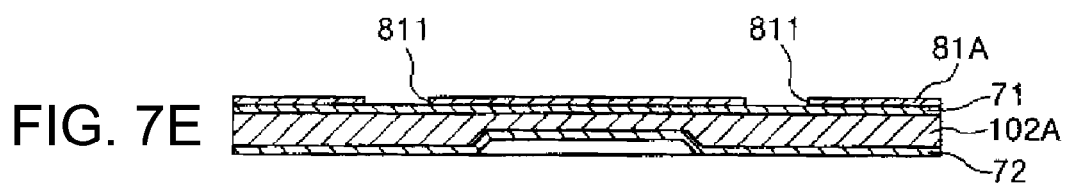

The resist film 81 is then so exposed to light and developed that part of the resist film 81 is removed to leave portions of the resist film 81 that correspond to regions where the movable plate 21, the support portion 22, and the pair of connecting portions 23 and 24 are formed. A resist film 81A having openings 811 is thus formed, as shown in FIG. 7E. Although not shown in FIG. 7E, an opening corresponding to the gap between the upper ends of the pair of beam members 231 and 232 is also formed in the resist film 81A.

B4

Figure 7F:
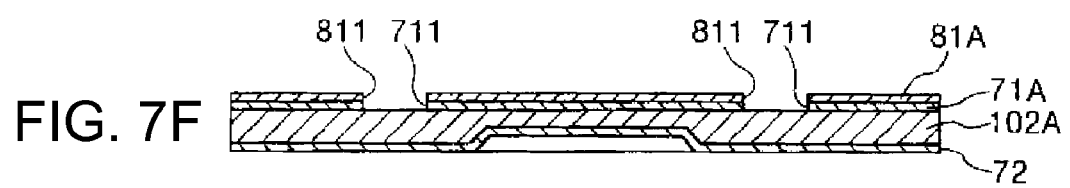

The resist film 81A is then used as a mask to etch away part of the nitride film 71. A nitride film 71A having openings 711 is thus formed, as shown in FIG. 7F. Although not shown in FIG. 7F, an opening corresponding to the gap between the upper ends of the pair of beam members 231 and 232 is also formed in the nitride film 71A.

The etching described above (method for forming openings 711) is not limited to a specific one and may, for example, be reactive ion etching (RIE) or dry etching using $CF_4$, as in step A5 described above.

B5

Figure 7G:
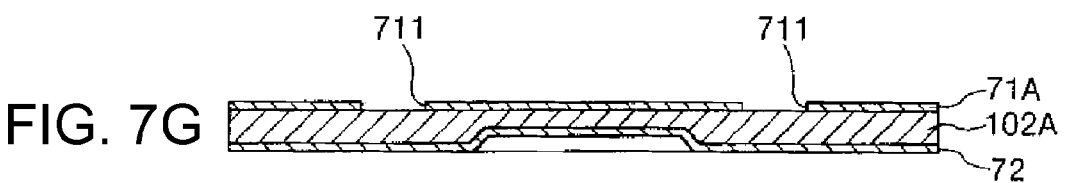

The resist film 81A is then removed. The removal of the resist film leaves the upper surface of the silicon substrate 102A covered with the nitride film 71A and the lower surface of the silicon substrate 102A covered with the nitride film 72, as shown in FIG. 7G.

A method for removing the resist film 81A is not limited to a specific one and may, for example, be sulfuric-acid washing or $O_2$ ashing.

B6

Figure 8A:
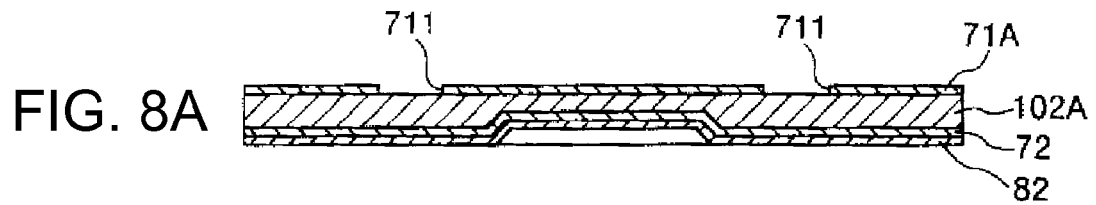
FIGS. 8A to 8G are cross-sectional views for describing the method for manufacturing the optical scanner shown in FIG. 1.

A resist film 82 is then formed on the nitride film 72, as shown in FIG. 8A.

The resist film 82 is made of a positive or negative resist material.

B7

Figure 8B:
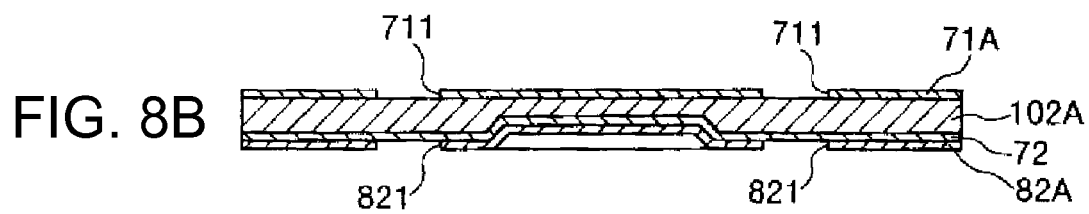

The resist film 82 is then so exposed to light and developed that part of the resist film 82 is removed to leave portions of the resist film 82 that correspond to regions where the movable plate 21, the support portion 22, and the pair of connecting portions 23 and 24 are formed. A resist film 82A having openings 821 is thus formed, as shown in FIG. 8B. Although not shown in FIG. 8B, an opening corresponding to the gap between the lower ends of the pair of beam members 231 and 232 is also formed in the resist film 82A.

B8

Figure 8C:
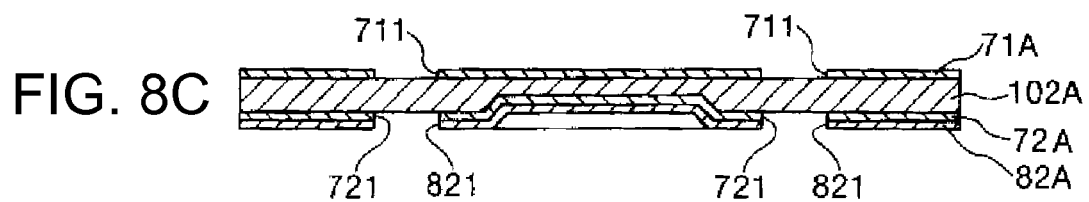

The resist film 82A is then used as a mask to etch away part of the nitride film 72. A nitride film 72A having openings 721 is thus formed, as shown in FIG. 8C. Although not shown in FIG. 8C, an opening corresponding to the gap between the lower ends of the pair of beam members 231 and 232 is also formed in the nitride film 72A.

The etching described above (method for forming openings 721) is not limited to a specific one and may, for example, be reactive ion etching (RIE) or dry etching using $CF_4$, as in step A5 described above.

B9

Figure 8D:
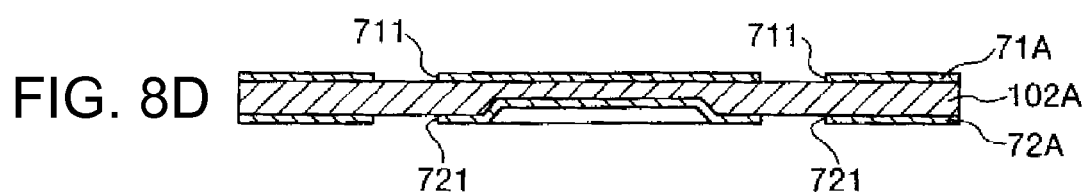

The resist film 82A is then removed. The removal of the resist film leaves the upper surface of the silicon substrate 102A covered with the nitride film 71A and the lower surface of the silicon substrate 102A covered with the nitride film 72A, as shown in FIG. 8D.

A method for removing the resist film 82A is not limited to a specific one and may, for example, be sulfuric-acid washing or $O_2$ ashing.

B10

Figure 8E:
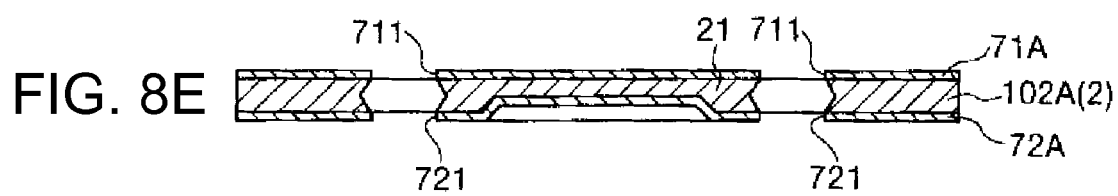

The nitride films 71A and 72A are then used as masks to anisotropically etch the silicon substrate 102A. The base 2 is thus provided, as shown in FIG. 8E. That is, in the anisotropic etching in the present step, the movable plate 21, the support portion 22, and the pair of connecting portions 23 and 24 are formed by anisotropically etching opposite sides of the silicon substrate 102A through the nitride film 72A, which is a first mask, and the nitride film 71A, which is a second mask.

The anisotropic etching described above (method for forming base 2) is not limited to a specific one and wet etching, for example, using a KOH aqueous solution can, for example, be used.

Formation of Movable Plate

Formation of the movable plate 21 in the anisotropic etching will be described in detail.

To provide the movable plate 21 having the shape in a plan view shown in FIG. 9 in the anisotropic etching, the nitride film 71A used as a mask has a portion 715 corresponding to the movable plate 21 and portions (correction masks) 716 to 718 for forming the angled portions of the stepped, truncated portion 251, as shown in FIG. 10. Although not shown, the nitride film 71A also has portions for forming the angled portions of the other truncated portions 252 to 254.

The movable plate 21 having the shape in the plan view described above can be formed by performing the anisotropic etching along with the nitride film 71A, which has the shape in the plan view of FIG. 10.

In this process, the area of each of the portions 716 to 718, which form correction masks, is determined in accordance with the thickness of the movable plate 21, that is, the thickness of the silicon substrate 102A that undergoes the anisotropic etching. In other words, it is necessary to increase the area with the thickness of the silicon substrate 102A. Further, the number of portions that form the correction masks is desirably equal to the number of angled portions of each of the truncated portions.

In view of the fact described above, the number of angled portions that can be formed for each of the truncated portions in the movable plate is limited by the area of the movable plate in a plan view and the thickness thereof.

In the present embodiment, the lengths A and B of the movable plate 21 are set to be greater than or equal to 1.0 mm but smaller than or equal to 2.5 mm, and the thickness of the silicon substrate 102A is set to be greater than or equal to 60 μm but smaller than or equal to 600 μm. The thus set dimensions allow the formed movable plate 21 to have the truncated portions 251 to 254, each of which has a two-step stepped portion described above.

Formation of Connecting Portions

Formation of the connecting portion 23 in the anisotropic etching will be described in detail. Formation of the connecting portion 24 will not be described because it is the same as the formation of the connecting portion 23.

Figure 11A:
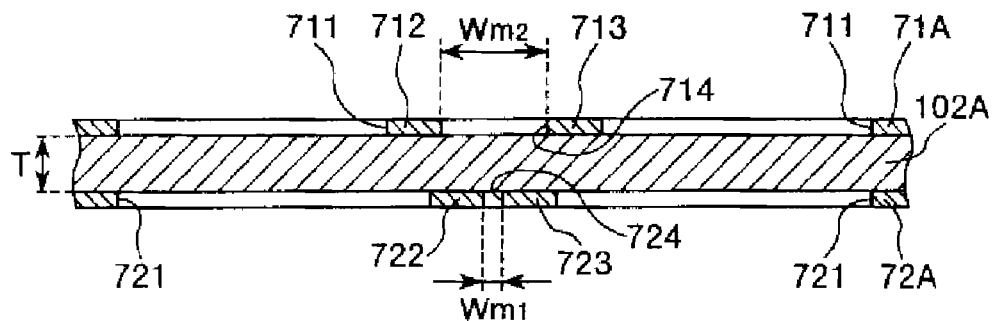
FIGS. 11A to 11D describe formation of a connecting portion in the etching step (when no mask shift occurs) shown in FIG. 8E.
Figure 11B:
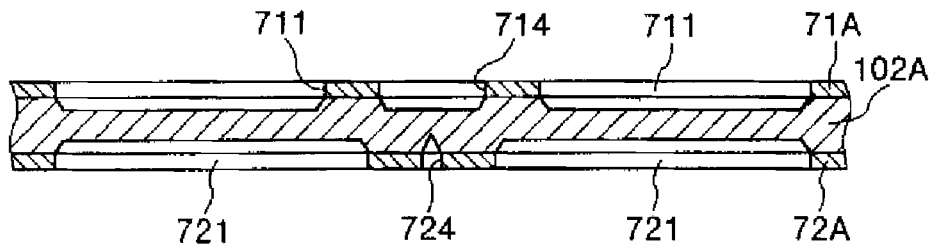
Figure 11C:
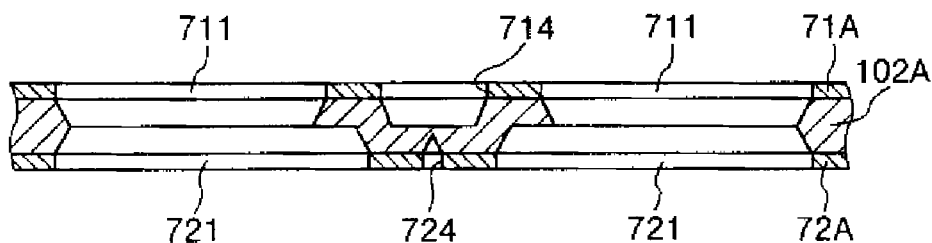

The nitride film 71A used as a mask (second mask) has a portion 712 formed in correspondence with a region where the upper surface of the beam member 231 of the connecting portion 23 is formed, a portion 713 formed in correspondence with a region where the upper surface of the beam member 232 of the connecting portion 23 is formed, and an opening (second opening) 714 formed between the portion 712 and the portion 713, as shown in FIG. 11A. The opening 714 is formed in correspondence with the gap between the upper ends of the pair of beam members 231 and 232.

Similarly, the nitride film 72A used as a mask (first mask) has a portion 722 formed in correspondence with a region where the lower surface of the beam member 231 of the connecting portion 23 is formed, a portion 723 formed in correspondence with a region where the lower surface of the beam member 232 of the connecting portion 23 is formed, and an opening (first opening) 724 formed between the portion 722 and the portion 723. The opening 724 is formed in correspondence with the gap between the lower ends of the pair of beam members 231 and 232.

Now, let $W_{m1}$ be the width of the opening 724, and T be the thickness of the silicon substrate 102A. The two values satisfy the following Expression (3).

$$W_{m1} < \frac{T}{\tan 54.73°} \qquad (3)$$

When the nitride film 72A, which is the first mask, and the nitride film 71A, which is the second mask, are shifted from each other so that steps are produced on a pair of side surfaces preferably formed of the silicon (111) surface of each of the beam members 231 and 232, but Expression (3) is satisfied, the step formed on one of the side surfaces and the step formed on the other side surface can be shifted in the thickness direction of the silicon substrate. As a result, in the resultant actuator, stress concentration in each of the beam members 231 and 232 that occurs at the time of pivotal motion of the movable plate 21 can be reduced.

Further, let $W_{m2}$ be the width of the opening 714. The value plus the two values described above satisfy the following Expression (4).

$$T < \frac{\tan 54.73°}{2}(W_{m1} + W_{m2}) \qquad (4)$$

When Expression (4) is satisfied, the connecting portion 23 formed of the pair of beam members 231 and 232 can be readily and reliably formed by anisotropically etching the opposite surfaces of the silicon substrate 102A having silicon (100) plate surfaces.

How steps are formed in the anisotropic etching in the present step will be described below in detail.

In the anisotropic etching in the present step, when the positions where the nitride films 71A and 72A, which are used as masks, are formed are not shifted from each other, the upper surface of the silicon substrate 102A is etched through the openings 711 and 714 and the lower surface of the silicon substrate 102A is etched through the openings 721 and 724, whereby the pair of beam members 231 and 232 are formed, as shown in FIGS. 11A to 11D.

Figure 11D:
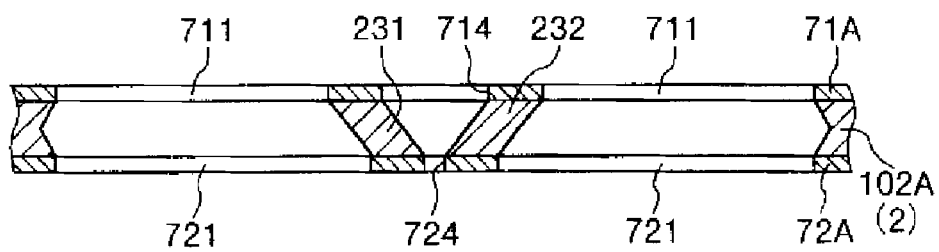

In this case, since the positions of the centers of the openings 714 and 724 in the width direction coincide with each other, each of the resultant side surfaces of the beam members 231 and 232 is a smooth inclined surface having no step and formed of the silicon (111) surface, as shown in FIG. 11D.

On the other hand, in the anisotropic etching in the present step, when the positions where the nitride films 71A and 72A, which are used as masks, are formed are shifted from each other, the upper surface of the silicon substrate 102A is etched through the openings 711 and 714 and the lower surface of the silicon substrate 102A is etched through the openings 721 and 724, whereby the pair of beam members 231 and 232 are formed, as shown in FIGS. 12A to 12D.

Figure 12A:
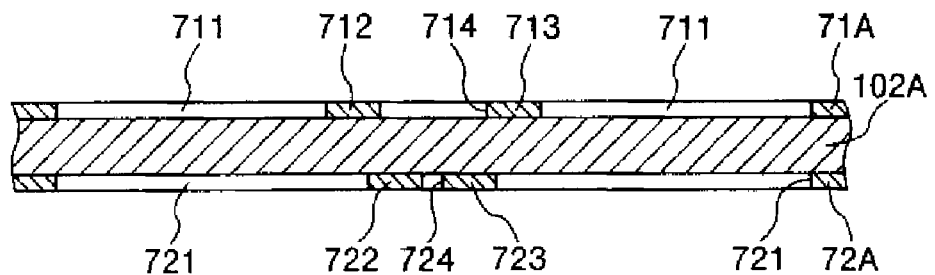
FIGS. 12A to 12D describe the formation of the connecting portion in the etching step (when mask shift occurs) shown in FIG. 8E.
Figure 12B:
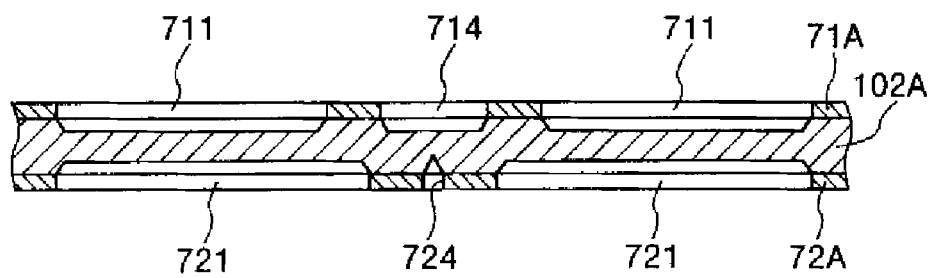
Figure 12C:
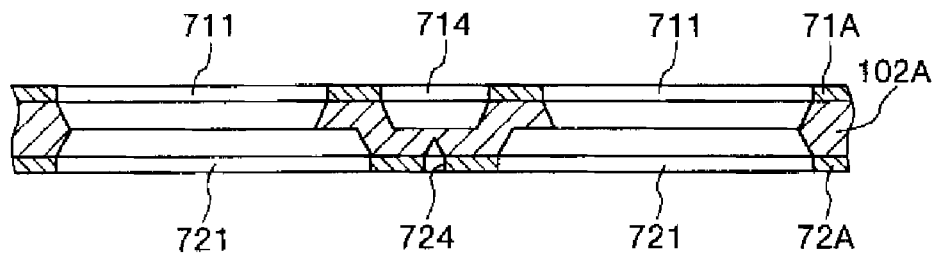
Figure 12D:
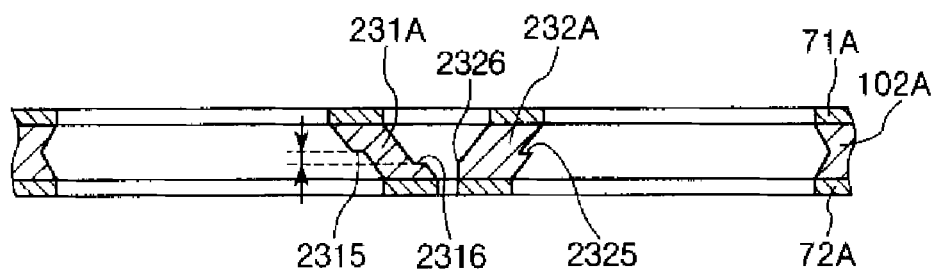

In this case, since the positions of the centers of the openings 714 and 724 in the width direction differ from each other, a step 2315 is formed on one of the side surfaces of the beam member 231, and a step 2316 is formed on the other side surface of the beam member 231, as shown in FIG. 12D. Similarly, a step 2325 is formed on one of the side surfaces of the beam member 232, and a step 2326 is formed on the other side surface of the beam member 232.

Since the width of the opening 724 in the nitride film 72A, which is used as a mask as described above, satisfies Expression (3) described above, the step 2316 is formed in a position away from the center in the thickness direction of the silicon substrate 102A and closer to the nitride film 72A (lower side).

In contrast, since the width of the opening 711 in the nitride film 71A and the width of the opening 721 in the nitride film 72A are much larger than the thickness of the silicon substrate 102A, the step 2315 is formed at the center in the thickness direction of the silicon substrate 102A.

As a result, the positions of the steps 2315 and 2316 differ from each other in the thickness direction of the silicon substrate 102A. Similarly, the positions of the steps 2325 and 2326 differ from each other in the thickness direction of the silicon substrate 102A.

As described above, since the positions of the steps 2315 and 2316 differ from each other in the thickness direction of the silicon substrate 102A, stress concentration in a central portion of the beam member 231 in the thickness direction can be prevented or reduced at the time of pivotal motion of the movable plate 21. Similarly, stress concentration in a central portion of the beam member 232 in the thickness direction can be prevented or reduced at the time of pivotal motion of the movable plate 21. As a result, the connecting portion 23 will not be damaged due to the stress concentration when the actuator is driven. Similarly, the connecting portion 24 will not be damaged due to the stress concentration when the actuator is driven.

If the width of the opening 724 does not satisfy Expression (3), the steps 2315, 2316, 2325, and 2326 are formed at the center in the thickness direction of the silicon substrate 102A. That is, the steps 2315, 2316, 2325, and 2326 are formed in the same position in the thickness direction of the silicon substrate 102A. As a result, the beam members could be damaged due to the stress concentration when the actuator is driven.

B11

Figure 8F:
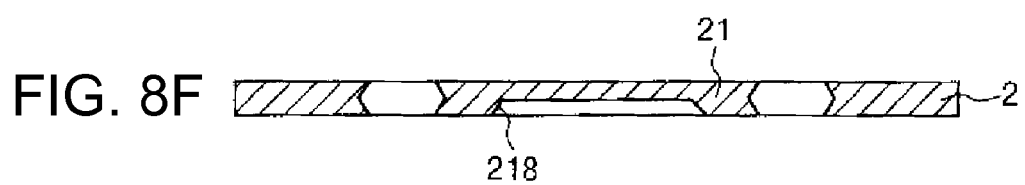

The nitride films 71A and 72A are then removed. The removal of the nitride films allows the upper and lower surfaces of the base 2 to be exposed, as shown in FIG. 8F.

A method for removing the nitride films 71A and 72A is not limited to a specific one and may, for example, be reactive ion etching (RIE), dry etching using $CF_4$, or a wet process using hot phosphoric acid, as in step A5 described above.

Further, the angled portions of the base 2 are rounded as required.

The process (rounding) is not limited to a specific one and may, for example, be isotropic etching using hydrofluoric acid, nitric acid, and acetic acid (or water) or a thermal treatment (under reduced pressure, at temperature ranging from about 1000 to 1200° C., in Ar atmosphere into which $H_2$ is introduced).

Figure 8G:
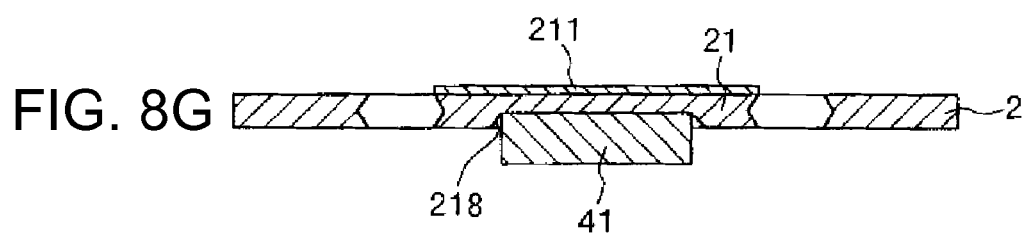

The permanent magnet 41 is then fixed to the lower surface of the movable plate 21 with an adhesive, as shown in FIG. 8G. Alternatively, a hard magnetic material may be fixed to the lower surface of the movable plate 21 with an adhesive and then magnetized to form the permanent magnet 41.

Further, a metal film is formed on the upper surface of the movable plate 21 to form the light reflector 211. A method for forming the metal film is not limited to a specific one and may, for example, be vacuum evaporation, sputtering (low-temperature sputtering), ion plating or any other dry plating, electrolysis plating, electroless plating or any other wet plating, flame spraying, or metal foil bonding.

Although not shown, the coil 42 is provided in the support 3, and the base 2 is bonded to the support 3.

The optical scanner 1 is thus produced by carrying out the steps described above.

In the resultant optical scanner 1 (actuator) manufactured in accordance with the method for manufacturing the optical scanner 1 described above, stress concentration in each of the beam members 231, 232, 241, and 242 at the time of pivotal motion of the movable plate 21 can be reduced because Expression (3) is satisfied.

In the optical scanner 1 (actuator) according to the first embodiment described above, since the movable plate 21 has the stepped, truncated portions 251 to 254, the moment of inertia at the time of pivotal motion of the movable plate 21 can be reduced while the light reflecting region of the movable plate 21 is ensured.

Further, anisotropic etching of a silicon substrate allows the movable plate 21 to be readily formed with precision.

Second Embodiment

A second embodiment of the invention will next be described.

Figure 13:
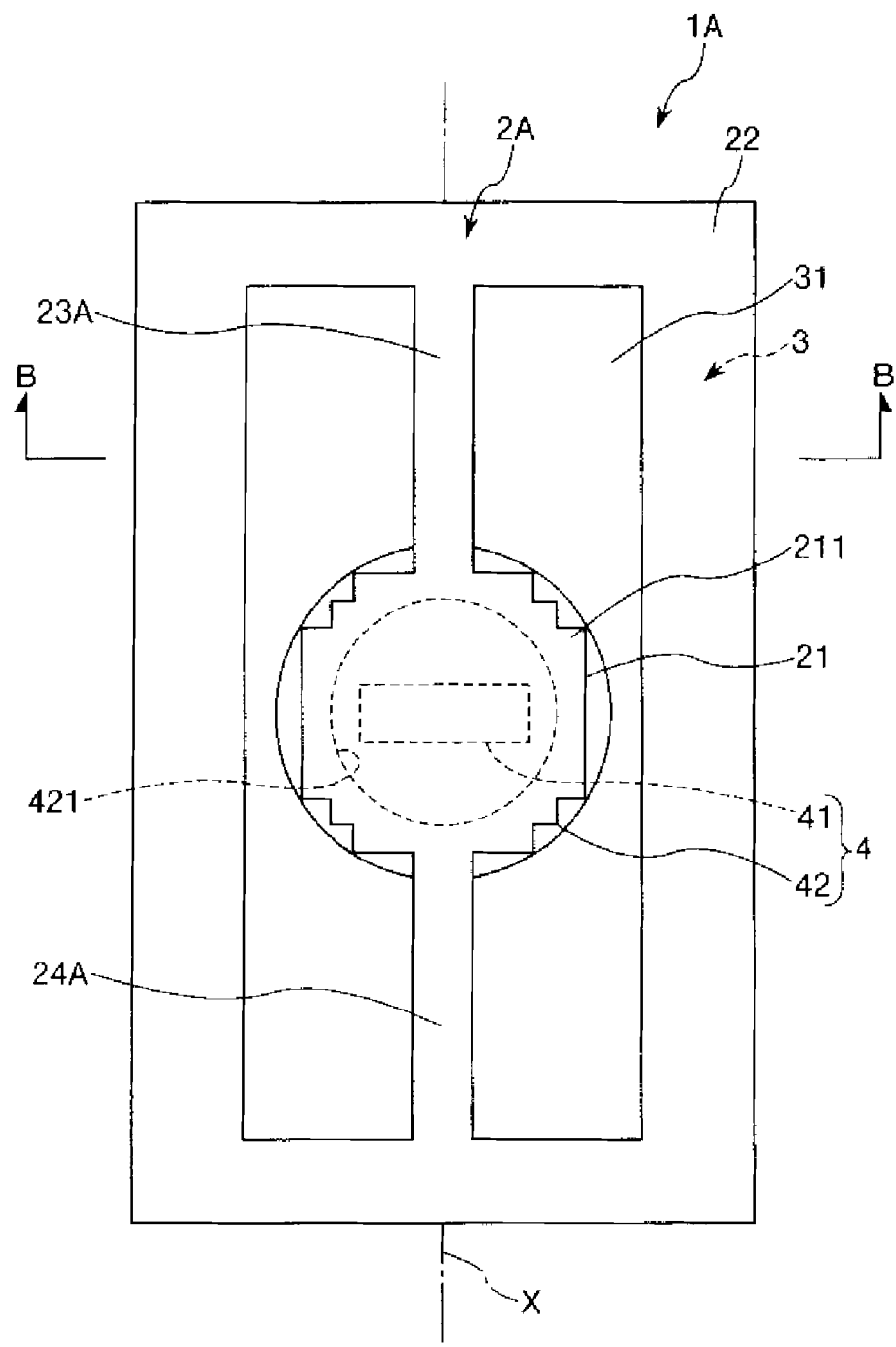
FIG. 13 is a plan view showing an optical scanner according to a second embodiment of the invention.
Figure 14:
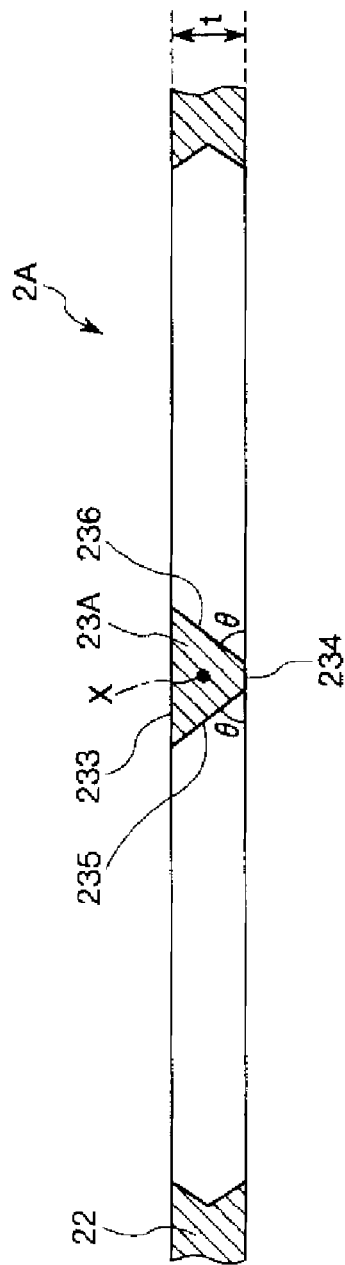
FIG. 14 is a partial enlarged cross-sectional view taken along the line B-B shown in FIG. 13.

FIG. 13 is a plan view showing an optical scanner according to the second embodiment of the invention, and FIG. 14 is a partial enlarged cross-sectional view taken along the line B-B shown in FIG. 13.

The optical scanner according to the second embodiment will be described below, primarily about what differs from the optical scanner according to the embodiment described above, and no description of the same items will be made.

The optical scanner according to the second embodiment is substantially the same as the optical scanner 1 according to the first embodiment but differs therefrom in terms of the transverse cross-sectional shape of the connecting portions. The same components as those in the embodiment described above have the same reference characters.

An optical scanner 1A according to the present embodiment includes a base 2A having an oscillatory system, as shown in FIG. 13. The base 2A includes a movable plate 21, a support portion 22, a pair of connecting portions 23A and 24A that pivotally connect the movable plate 21 to the support portion 22.

The connecting portion 23A will be described below as a representative one of the connecting portions 23A and 24A, and the connecting portion 24A will not be described because it is identical with the connecting portion 23A.

The connecting portion 23A is disposed along the axial line X and has a trapezoidal transverse cross-sectional shape.

More specifically, the connecting portion 23A has a symmetric shape with respect to a line that extends in the up-down direction and intersects the axial line X (bilaterally symmetric in FIG. 14) when viewed in the direction parallel to the axial line X (in other words, in the cross-sectional view of FIG. 14).

Further, in the cross-sectional view of FIG. 14, the width of the entire connecting portion 23A (gradually) increases in the direction from the lower side toward the upper side.

Further, the connecting portion 23A has an outer transverse cross-sectional shape formed of a pair of sides extending in the silicon (100) surface and a pair of sides extending in the silicon (111) surface. That is, the connecting portion 23A has an upper surface 233 and a lower surface 234, each of which is formed of the silicon (100) surface, and a pair of side surfaces 235 and 236, each of which is formed of the silicon (111) surface. The side surfaces 235 and 236 are inclined to the upper surface 233 or the lower surface 234 by an inclination angle θ of 54.73°. The connecting portion 23A, which has the transverse cross-sectional shape described above, can be readily formed with precision by anisotropically etching a silicon substrate having silicon (100) plate surfaces, as in the case of the connecting portion 23 in the first embodiment described above.

In the optical scanner 1A according to the second embodiment described above, the moment of inertia at the time of pivotal motion of the movable plate can also be reduced while the light reflecting region is ensured, and excellent dimensional precision of the movable plate can be readily ensured.

Third Embodiment

A third embodiment of the invention will next be described.

Figure 15:
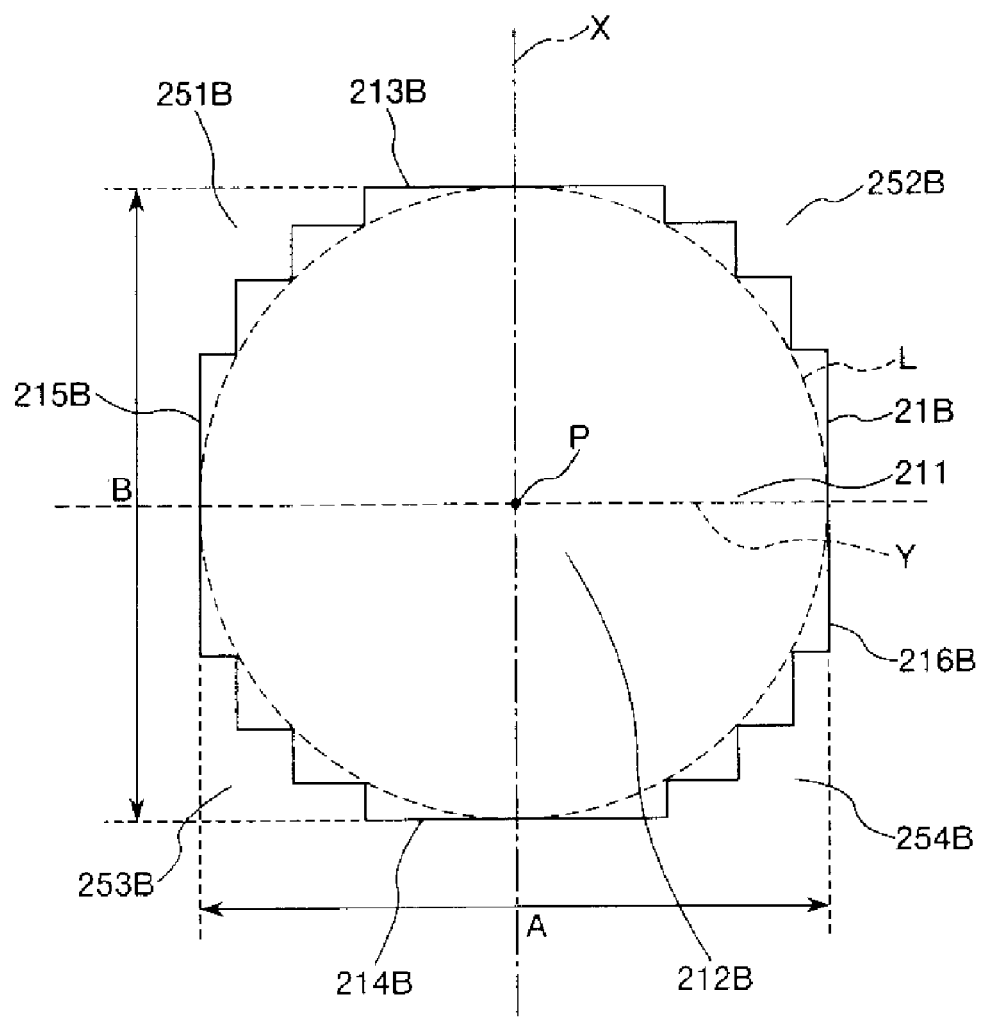
FIG. 15 is a plan view for describing a movable plate provided in an optical scanner according to a third embodiment of the invention.

FIG. 15 is a plan view for describing a movable plate provided in an optical scanner according to the third embodiment of the invention.

The optical scanner according to the third embodiment will be described below, primarily about what differs from the optical scanners according to the embodiments described above, and no description of the same items will be made.

The optical scanner according to the third embodiment is substantially the same as the optical scanner 1 according to the first embodiment but differs therefrom in terms of the shape of the movable plate in a plan view. The same components as those in the embodiments described above have the same reference characters.

In the optical scanner according to the present embodiment, each of the four corners of a movable plate 21B has a three-step stepped shape in a plan view along the thickness direction, as shown in FIG. 15. That is, each of the four corners has seven angled portions. In still other words, the length (width) of the movable plate 21B along the axial line X decreases stepwise in three steps with distance from the center toward both ends along the line Y in the plan view viewed along the thickness direction. As a result, the length (width) of the movable plate 21B along the axial line X has four values. The length (width) of the movable plate 21B along the line Y also decreases stepwise in three steps with distance from the center toward both ends along the axial line X in the plan view viewed along the thickness direction. As a result, the length (width) of the movable plate 21B along the line Y has four values. The light reflecting region of the movable plate 21B can therefore be efficiently ensured.

More specifically, the movable plate 21B includes a main body 212B, a pair of protrusions 213B and 214B that protrude from the main body 212B in opposite directions along the axial line X, and a pair of protrusions 215B and 216B that protrude from the main body 212B in opposite directions along the line Y.

A truncated portion 251B is formed between the protrusion 213B and the protrusion 215B. A truncated portion 252B is formed between the protrusion 213B and the protrusion 216B. A truncated portion 254B is formed between the protrusion 214B and the protrusion 216B. A truncated portion 253B is formed between the protrusion 214B and the protrusion 215B.

In the optical scanner according to the third embodiment described above, the moment of inertia at the time of pivotal motion of the movable plate can also be reduced while the light reflecting region is ensured, and excellent dimensional precision of the movable plate can be readily ensured.

Fourth Embodiment

A fourth embodiment of the invention will next be described.

Figure 16:
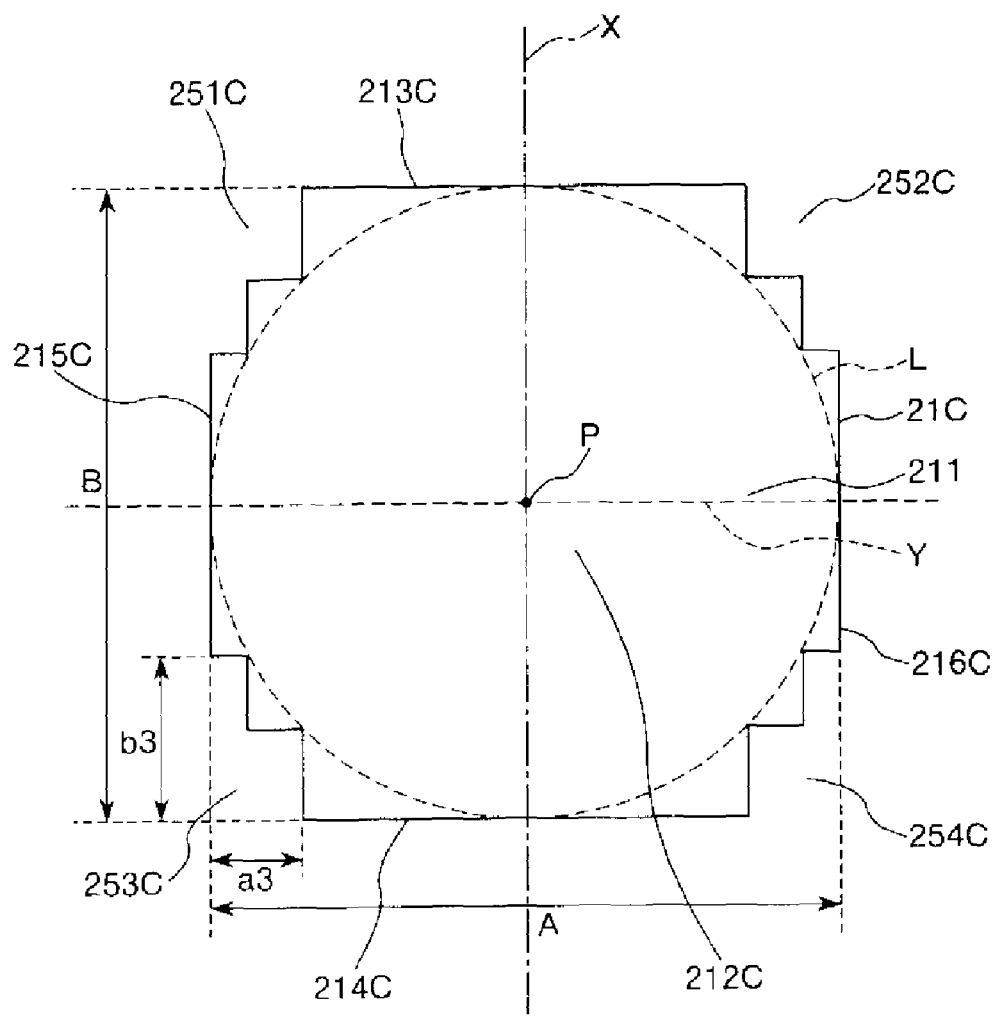
FIG. 16 is a plan view for describing a movable plate provided in an optical scanner according to a fourth embodiment of the invention.

FIG. 16 is a plan view for describing a movable plate provided in an optical scanner according to the fourth embodiment of the invention.

The optical scanner according to the fourth embodiment will be described below, primarily about what differs from the optical scanners according to the embodiments described above, and no description of the same items will be made.

The optical scanner according to the fourth embodiment is substantially the same as the optical scanner 1 according to the first embodiment but differs therefrom in terms of the shape of the movable plate in a plan view. The same components as those in the embodiments described above have the same reference characters.

A movable plate 21C provided in the optical scanner according to the present embodiment includes a main body 212C, a pair of protrusions 213C and 214C that protrude from the main body 212C in opposite directions along the axial line X, and a pair of protrusions 215C and 216C that protrude from the main body 212C in opposite directions along the line Y, as shown in FIG. 16.

A truncated portion 251C is formed between the protrusion 213C and the protrusion 215C. A truncated portion 252C is formed between the protrusion 213C and the protrusion 216C. A truncated portion 254C is formed between the protrusion 214C and the protrusion 216C. A truncated portion 253C is formed between the protrusion 214C and the protrusion 215C.

In the present embodiment, $a3 < b3$ is satisfied, where a3 is the length of each of the truncated portions 251C to 254C along the line Y and b3 is the length of each of the truncated portions 251C to 254C along the axial line X. That is, each of the truncated portions 251C to 254C is so shaped that the length along the axial line X is greater than the length along the line Y. The mass of end portions of the movable plate 21C that are remote from the axial line X can thus be efficiently reduced. The moment of inertia at the time of pivotal motion of the movable plate 21C can therefore be efficiently reduced.

In the optical scanner according to the fourth embodiment described above, the moment of inertia at the time of pivotal motion of the movable plate can also be reduced while the light reflecting region is ensured, and excellent dimensional precision of the movable plate can be readily ensured.

Fifth Embodiment

A fifth embodiment of the invention will next be described.

Figure 17:
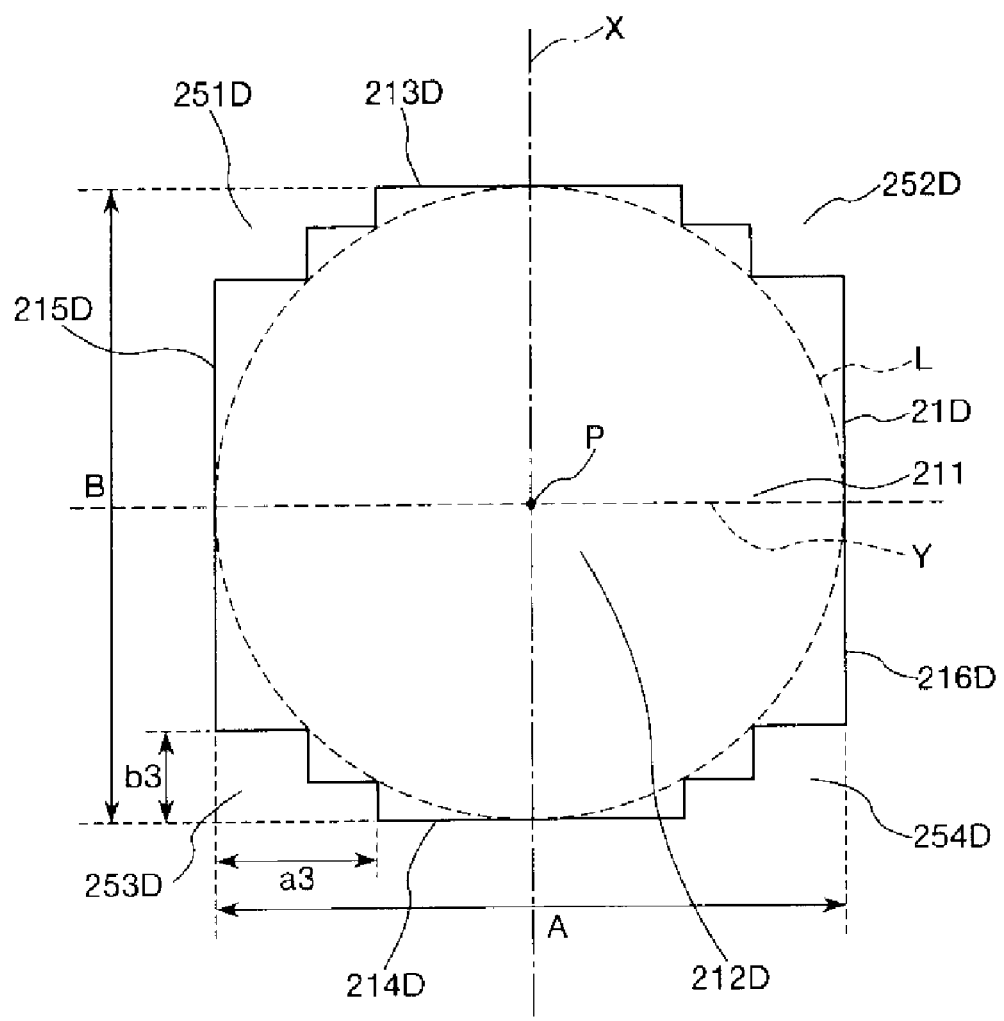
FIG. 17 is a plan view for describing a movable plate provided in an optical scanner according to a fifth embodiment of the invention.

FIG. 17 is a plan view for describing a movable plate provided in an optical scanner according to the fifth embodiment of the invention.

The optical scanner according to the fifth embodiment will be described below, primarily about what differs from the optical scanners according to the embodiments described above, and no description of the same items will be made.

The optical scanner according to the fifth embodiment is substantially the same as the optical scanner 1 according to the first embodiment but differs therefrom in terms of the shape of the movable plate in a plan view. The same components as those in the embodiments described above have the same reference characters.

A movable plate 21D provided in the optical scanner according to the present embodiment includes a main body 212D, a pair of protrusions 213D and 214D that protrude from the main body 212D in opposite directions along the axial line X, and a pair of protrusions 215D and 216D that protrude from the main body 212D in opposite directions along the line Y, as shown in FIG. 17.

A truncated portion 251D is formed between the protrusion 213D and the protrusion 215D. A truncated portion 252D is formed between the protrusion 213D and the protrusion 216D. A truncated portion 254D is formed between the protrusion 214D and the protrusion 216D. A truncated portion 253D is formed between the protrusion 214D and the protrusion 215D.

In the present embodiment, $a3 > b3$ is satisfied, where a3 is the length of each of the truncated portions 251D to 254D along the line Y and b3 is the length of each of the truncated portions 251D to 254D along the axial line X. That is, each of the truncated portions 251D to 254D is so shaped that the length along the axial line X is smaller than the length along the line Y. In the configuration described above, for example, when light is designed to be incident on the movable plate 21D at an angle of incidence inclined about the line Y, the light can be preferably reflected off the movable plate 21D.

In the optical scanner according to the fifth embodiment described above, the moment of inertia at the time of pivotal motion of the movable plate can also be reduced while the light reflecting region is ensured, and excellent dimensional precision of the movable plate can be readily ensured.

The optical scanners described above can suitably be used in a projector, a laser printer, an imaging display, a barcode reader, a scanning confocal microscope, and other image forming apparatus. Such an image forming apparatus therefore has excellent image drawing characteristics.

Image Forming Apparatus

An example of an image forming apparatus according to an embodiment of the invention will be described with reference to FIG. 18.

Figure 18:
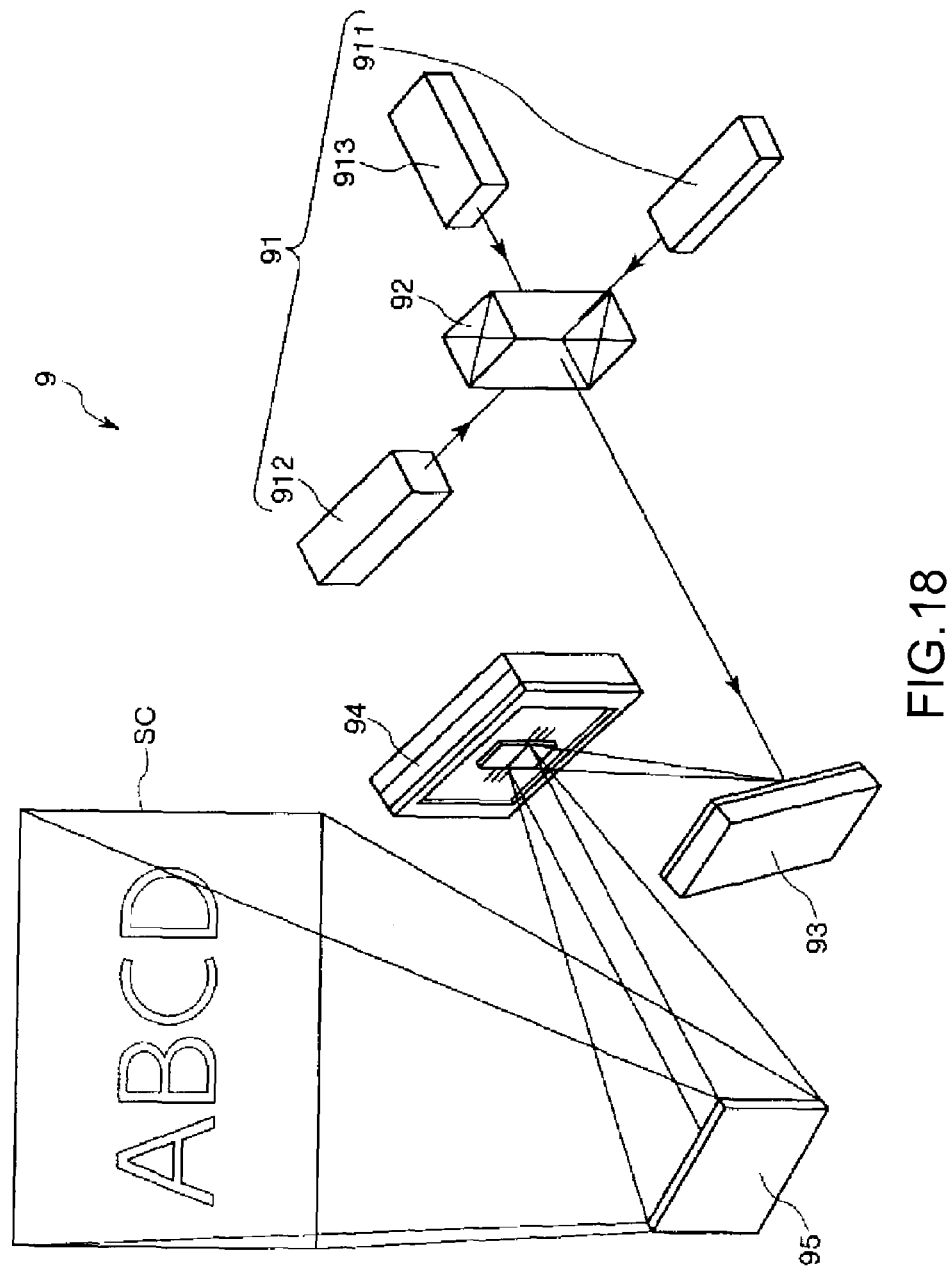
FIG. 18 is a schematic view showing an example of the configuration of an image forming apparatus according to an embodiment of the invention.

FIG. 18 is a schematic view showing an example of the configuration of the image forming apparatus according to the embodiment of the invention. In the following description, the longitudinal direction of a screen SC is called a "horizontal direction," and the direction perpendicular to the longitudinal direction is called a "vertical direction," for ease of description.

A projector 9 includes a light source apparatus 91 that outputs light, such as laser light, a cross-dichroic prism 92, a pair of optical scanners 93 and 94 according to any of the embodiments of the invention (optical scanner configured in the same manner as the optical scanner 1, for example), and a fixed mirror 95.

The light source apparatus 91 includes a red light source 911 that emits red light, a blue light source 912 that emits blue light, and a green light source 913 that emits green light.

The cross-dichroic prism 92 is an optical element that is formed by bonding four right-angle prisms and combines light fluxes emitted from the red light source 911, the blue light source 912, and the green light source 913.

In the thus configured projector 9, the cross-dichroic prism 92 combines the light fluxes emitted from the red light source 911, the blue light source 912, and the green light source 913 based on image information from a host computer (not shown), and the combined light is deflected by the optical scanners 93 and 94, reflected off the fixed mirror 95, and forms a color image on the screen SC.

How the optical scanners 93 and 94 deflect light will be specifically described.

The light combined in the cross-dichroic prism 92 is first deflected by the optical scanner 93 in the horizontal direction (primary scan). The light deflected in the horizontal direction is then further deflected by the optical scanner 94 in the vertical direction (secondary scan). A two-dimensional color image can thus be formed on the screen SC. Using the optical scanner according to any of the embodiments of the invention as each of the optical scanners 93 and 94 provides extremely excellent image drawing characteristics.

It is noted that the projector 9 is not necessarily configured as described above but can be configured differently as long as the optical scanners deflect light to form an image on an intended surface. For example, the fixed mirror 95 can be omitted.

According to the thus configured projector 9, which includes the optical scanners 93 and 94, each of which has the same configuration as that of the optical scanner 1 described above, a high-quality image can be produced at a low cost.

The actuators, the optical scanners, and the image forming apparatus according to the embodiments of the invention have been described with reference to the drawings, but the invention is not limited to the embodiments. For example, the configuration of each of the actuators, the optical scanners, and the image forming apparatus according to the embodiments of the invention can be replaced with an arbitrary configuration that provides the same function as that provided in the embodiments described above and an arbitrary component can be added.

The above embodiments have been described with reference to the case where the movable plate has a symmetrical shape with respect to at least one of the pivotal central axis and a line perpendicular thereto in a plan view, but the movable plate is not necessarily shaped this way. The movable plate may have an asymmetrical shape with respect to the pivotal central axis and a line perpendicular thereto in a plan view.

The above embodiments have been described with reference to the case where the actuator according to any of the embodiments of the invention is used as an optical scanner, but the actuator according to any of the embodiments of the invention is not necessarily used as an optical scanner. For example, the actuator according to any of the embodiments of the invention can be used as an optical switch, an optical attenuator, or any other optical device.

The above embodiments have been described with reference to the case where the driver that allows the movable plate to pivot is a moving magnet driver that electromagnetically drives the movable plate. The driver may alternatively be a moving coil driver that electromagnetically drives the movable plate, an electrostatic driver, a piezoelectric driver, or any other driver based on a non-electromagnetic driving method.

What is claimed is:

1. An actuator comprising:
a movable portion that swings about a swing axis;
a connecting portion that extends from the movable portion and torsionally deforms in response to the swinging of the movable portion; and
a support portion that supports the connecting portion,
wherein the movable portion is so shaped that the length thereof parallel to the swing axis decreases stepwise with distance from the swing axis in a plan view.

2. The actuator according to claim 1,
wherein the length of the movable portion parallel to the swing axis decreases in two steps with distance from the swing axis in the plan view.

3. The actuator according to claim 1,
wherein the movable portion has an outer shape in the plan view that is formed primarily of a line segment parallel to the swing axis and a line segment perpendicular to the swing axis.

4. The actuator according to claim 1,
wherein each plate surface of the movable portion is formed of a silicon (100) surface.

5. The actuator according to claim 1,
wherein a side surface of the movable portion is primarily formed of a silicon (111) surface.

6. The actuator according to claim 5,
wherein a groove having a V-like shape in a cross-sectional view taken along a plane perpendicular to plate surfaces of the movable portion is formed in the side surface of the movable portion.

7. The actuator according to claim 1,
wherein surfaces of the connecting portion are formed of a silicon (100) surface and a silicon (111) surface.

8. The actuator according to claim 1,
wherein the movable portion has a shape symmetric with respect to the swing axis in the plan view.

9. The actuator according to claim 8,
wherein the movable portion has a shape symmetric with respect to a line passing through a center of the movable portion and perpendicular to the swing axis in the plan view.

10. An optical scanner comprising:
a movable portion that includes a light reflector having light reflectivity and swings about a swing axis;
a connecting portion that extends from the movable portion and torsionally deforms in response to the swinging of the movable portion; and
a support portion that supports the connecting portion,
wherein the movable portion is so shaped that the length thereof parallel to the swing axis decreases stepwise with distance from the swing axis in a plan view.

11. An image forming apparatus comprising:
a light source that emits light; and
an optical scanner that deflects light from the light source,
wherein the optical scanner includes
   a movable portion that includes a light reflector having light reflectivity and swings about a swing axis,
   a connecting portion that extends from the movable portion and torsionally deforms in response to the swinging of the movable portion, and
   a support portion that supports the connecting portion,
the movable portion is so shaped that the length thereof parallel to the swing axis decreases stepwise with distance from the swing axis in a plan view.

\* \* \* \* \*